(12) United States Patent
Lee et al.

(10) Patent No.: US 9,419,011 B2
(45) Date of Patent: Aug. 16, 2016

(54) THREE-DIMENSIONAL SEMICONDUCTOR DEVICES

(71) Applicant: Samsung Electronics Co., Ltd., Suwon-si (KR)

(72) Inventors: Sunyeong Lee, Hwaseong-si (KR); Kyoung-Hoon Kim, Yongin-si (KR); Jin-Woo Park, Gunpo-si (KR); SeungWoo Paek, Yongin-si (KR); Seok-won Lee, Yongin-si (KR); Taekeun Cho, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/588,506

(22) Filed: Jan. 2, 2015

(65) Prior Publication Data

US 2015/0235939 A1    Aug. 20, 2015

(30) Foreign Application Priority Data

Feb. 14, 2014  (KR) .................... 10-2014-0017391

(51) Int. Cl.
*H01L 27/00*    (2006.01)
*H01L 27/115*   (2006.01)

(52) U.S. Cl.
CPC .... *H01L 27/11582* (2013.01); *H01L 27/11519* (2013.01); *H01L 27/11526* (2013.01); *H01L 27/11548* (2013.01); *H01L 27/11551* (2013.01); *H01L 27/11556* (2013.01); *H01L 27/11565* (2013.01); *H01L 27/11573* (2013.01); *H01L 27/11575* (2013.01); *H01L 27/11578* (2013.01); *H01L 2224/32145* (2013.01)

(58) Field of Classification Search
CPC ............... H01L 27/11578; H01L 2224/32145; H01L 27/11551; H01L 27/11573; H01L 27/11526; H01L 27/11565
See application file for complete search history.

(56) References Cited

U.S. PATENT DOCUMENTS

| | | | |
|---|---|---|---|
| 8,148,769 B2 | 4/2012 | Kito et al. | |
| 8,394,716 B2 | 3/2013 | Hwang et al. | |
| 8,456,909 B2 | 6/2013 | Lee et al. | |
| 2010/0133598 A1 | 6/2010 | Chae et al. | |
| 2011/0092038 A1* | 4/2011 | Choi ................. | H01L 27/11526 438/268 |
| 2011/0104869 A1* | 5/2011 | Hyun ................. | H01L 27/11551 438/430 |
| 2011/0227141 A1 | 9/2011 | Jeong et al. | |
| 2012/0052672 A1 | 3/2012 | Nakanishi et al. | |
| 2012/0119283 A1* | 5/2012 | Lee ................... | H01L 27/11519 257/316 |
| 2013/0009229 A1 | 1/2013 | Lee et al. | |
| 2013/0032874 A1 | 2/2013 | Ko | |
| 2013/0320486 A1 | 12/2013 | Yoo et al. | |
| 2013/0334575 A1* | 12/2013 | Chen ................. | H01L 27/11565 257/202 |
| 2014/0063890 A1* | 3/2014 | Lee ................... | H01L 27/11519 365/63 |

(Continued)

FOREIGN PATENT DOCUMENTS

KR    10-2011-0015337 A    2/2011
KR    10-2011-0120536 A    11/2011

*Primary Examiner* — Ngan Ngo
(74) *Attorney, Agent, or Firm* — Muir Patent Law, PLLC

(57) ABSTRACT

Three-dimensional (3D) semiconductor devices are provided. The 3D semiconductor device includes a plurality of dummy pillars penetrating each cell pad of an electrode structure and the electrode structure disposed under each cell pad. Insulating patterns of a mold stack structure for formation of the electrode structure may be supported by the plurality of dummy pillars, so transformation and contact of the insulating patterns may be minimized or prevented.

20 Claims, 26 Drawing Sheets

(56) References Cited

U.S. PATENT DOCUMENTS

| | | | |
|---|---|---|---|
| 2014/0226397 A1* | 8/2014 | Ahn | G11C 16/3422 365/185.02 |
| 2015/0001460 A1* | 1/2015 | Kim | H01L 27/11578 257/5 |
| 2015/0287710 A1* | 10/2015 | Yun | H01L 27/1157 257/314 |
| 2016/0078958 A1* | 3/2016 | Wang | G11C 16/32 365/185.11 |
| 2016/0079258 A1* | 3/2016 | Lee | H01L 27/11568 365/185.29 |

\* cited by examiner

THREE-DIMENSIONAL SEMICONDUCTOR DEVICES

CROSS-REFERENCE TO RELATED APPLICATION

This U.S. non-provisional patent application claims priority under 35 U.S.C. §119 to Korean Patent Application No. 10-2014-0017391, filed on Feb. 14, 2014, in the Korean Intellectual Property Office, the disclosure of which is hereby incorporated by reference in its entirety.

BACKGROUND

The disclosed embodiments relate to semiconductor devices and, more particularly, to three-dimensional (3D) semiconductor devices.

Semiconductor devices are becoming more highly integrated to provide high performance and low costs thereof. The integration density of semiconductor devices affects the costs of the semiconductor devices, so highly integrated semiconductor devices are demanded. An integration degree of a conventional two-dimensional (2D) or planar memory device may be mainly determined by a planar area of a unit memory cell. Thus, the integration density of the conventional 2D memory device may be greatly affected by a technique for forming fine patterns. However, forming the fine patterns is typically an expensive procedure that has a certain limitation in increasing the integration density.

Three-dimensional (3D) semiconductor devices including three-dimensionally arranged memory cells have been developed to overcome the above limitations.

SUMMARY

Embodiments of the inventive concepts include 3D semiconductor devices capable of minimizing or preventing deterioration of a stack structure.

In one embodiment, a 3D semiconductor device may include an electrode structure disposed on a substrate including a first region and a second region, the electrode structure comprising a ground selection electrode, a string selection electrode, and cell electrodes sequentially stacked between the ground and string selection electrodes, and the ground selection electrode, the cell electrodes, and the string selection electrode respectively including a ground selection pad, cell pads, and a string selection pad which constitute a stepped structure in the second region a plurality of vertical patterns penetrating the electrode structure in the first region, a plurality of dummy pillars penetrating each of the cell pads and the electrode structure disposed under each of the cell pads, and a contact plug connected to each of the cell pads. The dummy pillars penetrating each of the cell pads may include a dummy pillar penetrating a boundary between each of the cell pads and a pad adjacent thereto.

In some embodiments, each contact plug connected to a respective cell pad may be surrounded by a set of the dummy pillars penetrating the respective cell pad when viewed from a plan view.

In some embodiments, the dummy pillars penetrating each of the cell pads may include a second dummy pillar laterally spaced apart from the boundary. The contact plug connected to each of the cell pads may be aligned with the dummy pillar penetrating the boundary in a longitudinal direction of the electrode structure and may be aligned with the second dummy pillar in a direction perpendicular to the longitudinal direction.

In some embodiments, each of the dummy pillars may include the same material as the vertical pattern.

In some embodiments, top surfaces of the dummy pillars may be disposed at a substantially same level as top surfaces of the vertical patterns, and bottom surfaces of the dummy pillars may be disposed at a substantially same level as bottom surfaces of the vertical patterns.

In some embodiments, each of the vertical patterns may include a vertical semiconductor pattern extending upward from the substrate. A tunnel insulating layer, a charge storage layer, and a blocking insulating layer may be disposed between the vertical semiconductor pattern and each of the cell electrodes.

In an embodiment, a 3D semiconductor device may include an electrode structure disposed on a substrate including a first region and a second region, the electrode structure comprising a ground selection electrode, a string selection electrode, and cell electrodes sequentially stacked between the ground and string selection electrodes, and the ground selection electrode, the cell electrodes, and the string selection electrode respectively including a ground selection pad, cell pads, and a string selection pad which constitute a stepped structure in the second region, a plurality of vertical patterns penetrating the electrode structure in the first region, a plurality of dummy pillars penetrating each of the cell pads and the electrode structure disposed under each of the cell pads, and a contact plug connected to each of the cell pads. The dummy pillars penetrating each of the cell pads may surround the contact plug connected to the respective cell pad when viewed from a plan view.

In some embodiments, the set of dummy pillars penetrating each of the cell pads may include dummy pillars respectively disposed at vertices of a first imaginary polygon, and the contact plug connected to each of the cell pads may be disposed at a central point of the first imaginary polygon.

In some embodiments, the vertical patterns may include: outer vertical patterns penetrating an edge region of the electrode structure in a plan view; and inner vertical patterns penetrating a central region of the electrode structure in a plan view. Each of the inner vertical patterns may be disposed at a central point of a second imaginary polygon, and neighboring vertical patterns surrounding each of the inner vertical patterns may be disposed at vertices of the second imaginary polygon, respectively. The number of sides of the first imaginary polygon may be equal to the number of sides of the second imaginary polygon.

In some embodiments, an area of the first imaginary polygon may be different from an area of the second imaginary polygon.

In some embodiments, each of the first and second imaginary polygons may be a hexagon.

In some embodiments, the set of dummy pillars penetrating each of the cell pads may include a first dummy pillar penetrating a boundary between each of cell pads and a pad adjacent thereto; a second dummy pillar laterally spaced apart from the boundary, and an additional dummy pillar penetrating the boundary at a side of the first dummy pillar and aligned with the second dummy pillar in a longitudinal direction of the electrode structure.

In some embodiments, one side of the first imaginary polygon may overlap with a boundary between each of cell pads and a pad adjacent thereto, and the dummy pillars disposed at both vertices of the one side of the first imaginary polygon may penetrate the boundary.

In some embodiments, top surfaces of the dummy pillars may be disposed at the substantially same level as top surfaces of the vertical patterns, and bottom surfaces of the dummy pillars may be disposed at the substantially same level bottom surfaces of the dummy pillars.

In some embodiments, the dummy pillar may include the same material as the vertical pattern.

In an embodiment, a 3D semiconductor device may include a substrate including a first region and a second region, a stack structure including a plurality of electrodes vertically stacked on the substrate, each of the electrodes including sidewall on the second region and the sidewalls of the electrodes disposed at horizontal positions different from each other, respectively, on the second region, a plurality of vertical patterns penetrating the stack structure in the first region, a contact plug connected to each of the electrodes in the second region, and a plurality of dummy pillars penetrating the stack structure in the second region. A set of the dummy pillars may be disposed to surround the contact plug when viewed from a plan view.

In some embodiments, at least one of the dummy pillars may penetrate a boundary between vertically adjacent the electrodes.

In some embodiments, each of the vertical patterns may include a semiconductor pattern penetrating the stack structure to connected to the substrate and a vertical insulating layer surrounding a sidewall of the semiconductor pattern, and each of the dummy pillars has the same structure as the vertical patterns.

In some embodiments, the dummy pillars may penetrate all or some of the electrodes.

In some embodiments, the dummy pillars may have a vertical length which is substantially the same as a vertical length of the vertical patterns.

BRIEF DESCRIPTION OF THE DRAWINGS

The various embodiments will become more apparent in view of the attached drawings and accompanying detailed description.

DETAILED DESCRIPTION OF THE EMBODIMENTS

Figure 1:
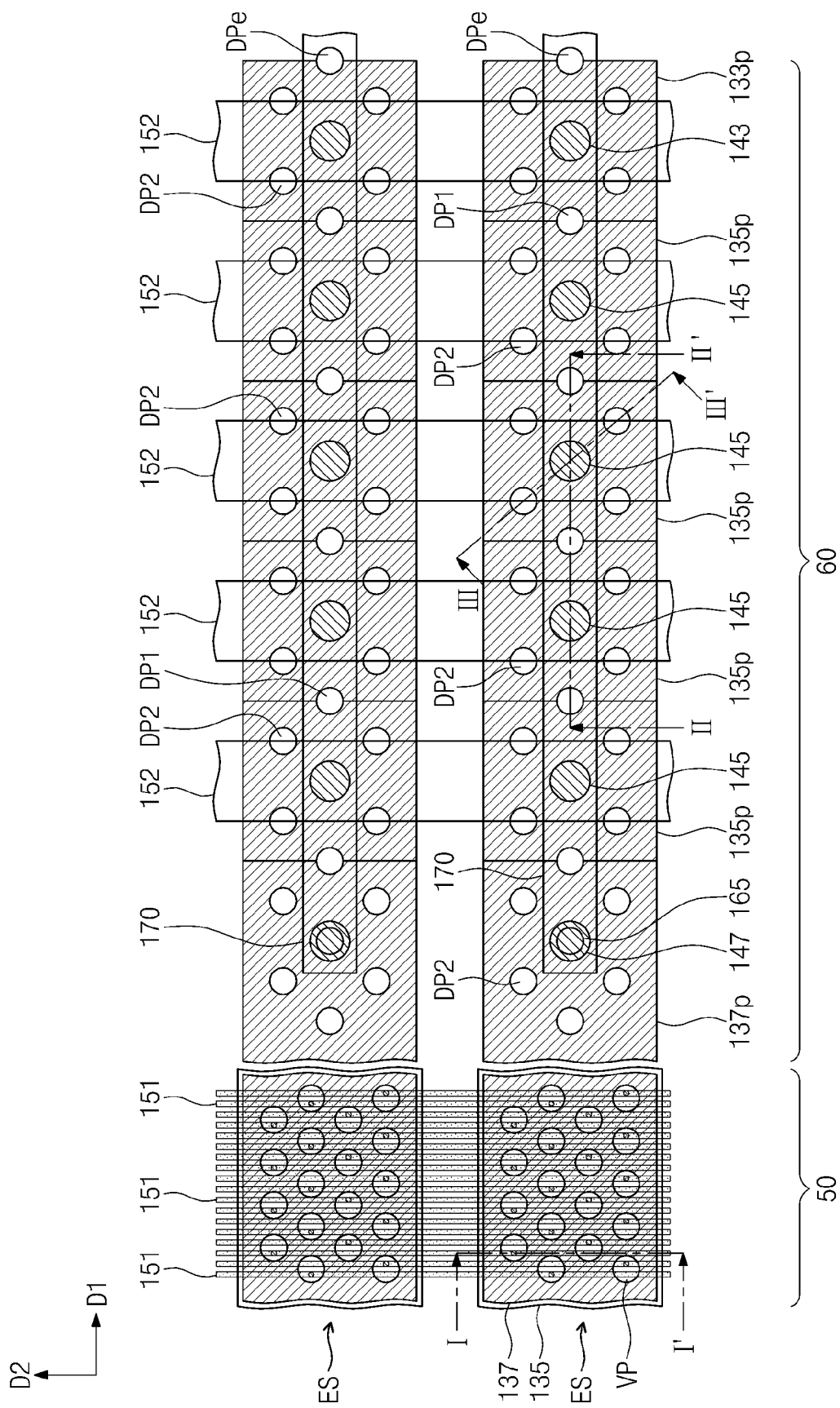
FIG. 1 is a plan view illustrating a three-dimensional (3D) semiconductor device according to some embodiments of the inventive concepts.

The present disclosure will now be described more fully hereinafter with reference to the accompanying drawings, in which exemplary embodiments of the inventive concepts are shown. The advantages and features of the inventive concepts and methods of achieving them will be apparent from the following exemplary embodiments. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. However, the term "contact," as used herein refers to direct contact, or touching, unless otherwise indicated. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are not meant to limit the embodiments to specific shapes of elements.

It will be also understood that although the terms first, second, third etc. may be used herein to describe various elements, these elements should not be limited by these terms. Unless the context indicates otherwise, these terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same or similar elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2:
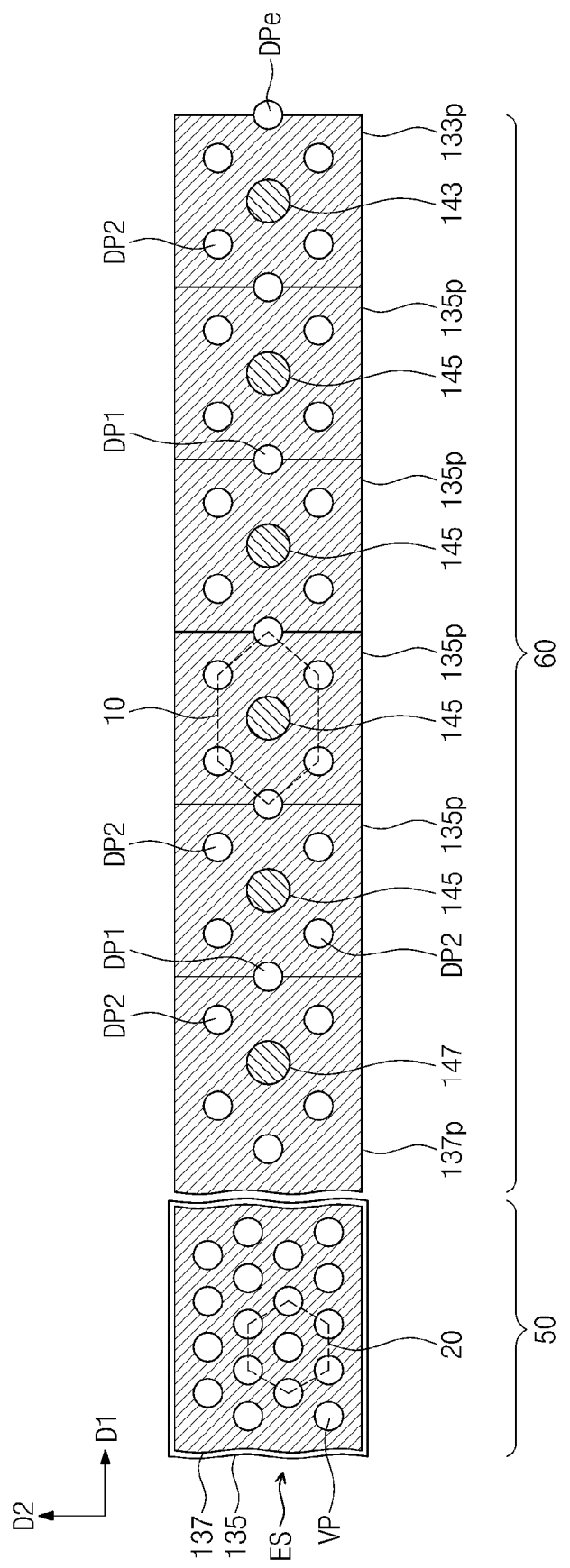
FIG. 2 is a plan view illustrating dummy pillars of the 3D semiconductor device illustrated in FIG. 1 according to an exemplary embodiment of the inventive concept.
Figure 3:
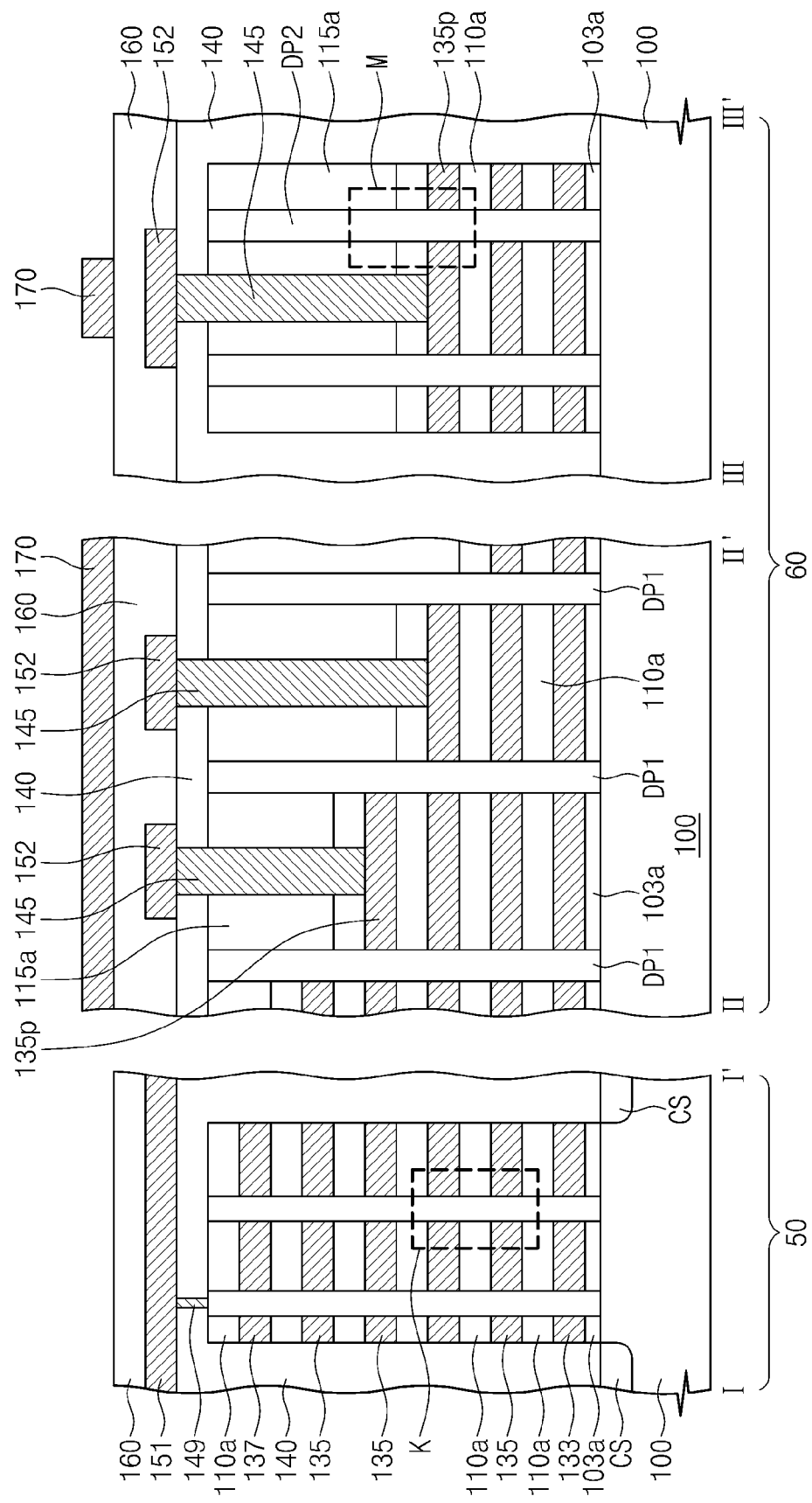
FIG. 3 is a cross-sectional view taken along lines I-I', II-II', and III-III' of FIG. 1 according to an exemplary embodiment of the inventive concept.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning FIG. 1 is a plan view illustrating a three-dimensional (3D) semiconductor device according to some embodiments of the inventive concepts. FIG. 2 is a plan view illustrating one electrode structure to explain dummy pillars of the 3D semiconductor device illustrated in FIG. 1. In FIG. 2, interconnections of FIG. 1 are omitted to more clearly illustrate arrangement of the dummy pillars. FIG. 3 is a cross-sectional view taken along lines I-I', II-II', and III-III' of FIG. 1.

As used herein, a semiconductor device may refer to any of the various devices such as shown in FIGS. 1-24, and may also refer, for example, to one or more transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as described herein, may refer to these semiconductor devices, but may additionally include products that include these devices, such as a memory module, a hard drive including additional components, or a mobile phone, laptop, tablet, desktop, camera, or other consumer electronic device, etc.

Referring to FIGS. 1, 2 and 3, a substrate 100 may include a first region 50 and a second region 60. The substrate 100 may be a semiconductor substrate such as a silicon substrate, a germanium substrate, or a silicon-germanium substrate. The first region 50 may correspond to a cell region in which memory cells are three-dimensionally arranged, and the second region 60 may correspond to a connection region in which pads are formed.

Electrode structures ES are disposed on the substrate 100. The electrode structures ES may extend from the first region 50 into the second region 60. The electrode structures ES may extend in parallel along a first direction D1. Each of the electrode structures ES may include electrodes 133, 135 and 137 sequentially stacked on the substrate 100 of the first region 50. The stacked electrodes 133, 135 and 137 are insulated from each other. In one embodiment, each of the electrode structures ES may include insulating patterns 110a disposed between the stacked electrodes 133, 135 and 137. The electrodes 133, 135 and 137 and the insulating patterns 110a may be alternately stacked on the substrate 100. The electrodes 133, 135 and 137 may respectively include pads 133p, 135p and 137p constituting a stepped structure in the second region 60. In an embodiment, the pads 133p, 135p and 137p may respectively extend from the electrodes 133, 135 and 137 disposed in the first region 50 to constitute the stepped structure in the second region 60. The insulating patterns 110a may also extend into the second region 60 to cover the pads 133p, 135p and 137p, respectively.

The electrodes 133, 135 and 137 of each of the electrode structures ES may include a ground selection electrode 133, a string selection electrode 137, and cell electrodes 135 sequentially stacked between the ground and string selection electrodes 133 and 137. The pads 133p, 135p and 137p may include a ground selection pad 133p, cell pads 135p, and a string selection pad 137p. The ground selection, cell and string selection pads 133p, 135p and 137p may extend from the ground selection, cell and string selection electrodes 133, 135 and 137, respectively.

Each of the electrode structures ES may further include a capping insulation pattern 115a that covers at least the ground selection and cell pads 133p and 135p in the second region 60. The capping insulation pattern 115a may be formed, for example, of an insulating material (e.g., silicon oxide). In one embodiment, each of the electrode structures ES may further include a buffer insulating pattern 103a disposed under the ground selection electrode 133 and the ground selection pad 133p. The buffer insulating pattern 103a may be formed of an insulating material (e.g., silicon oxide).

A plurality of vertical patterns VP may penetrate each of the electrode structures ES in the first region 50. The vertical patterns VP may be in contact with the substrate 100. Each of the vertical patterns VP may include at least a semiconductor layer. The vertical patterns VP will be described in more detail with reference to FIGS. 4A to 4D.

As illustrated in FIGS. 1 and 2, the vertical patterns VP may be two-dimensionally arranged when viewed from a plan view. The vertical patterns VP may constitute a plurality of rows parallel to the first direction D1. In some embodiments, the vertical patterns VP penetrating each of the electrode structures ES may constitute four rows. The vertical patterns VP constituting two rows adjacent to each other in the four rows may be arranged in a zigzag form along the first direction D1. Thus the vertical patterns VP may be formed in an alternating manner among two adjacent rows.

Dummy pillars DP1, DP2 and DPe penetrate the electrode structures ES in the second region 60. The dummy pillars DP1, DP2 and DPe may be in contact with the substrate 100. As illustrated in FIG. 3, top surfaces of the dummy pillars DP1, DP2 and DPe may be disposed at the same level (or the same height) as top surfaces of the vertical patterns VP. Bottom surfaces of the dummy pillars DP1, DP2 and DPe may be disposed at the same level (or the same height) as bottom surfaces of the vertical patterns VP. Each of the dummy pillars DP1, DP2 and DPe may include the same material as the vertical pattern VP. This will be described in more detail with reference to FIGS. FIG. 4A to 4D.

A plurality of dummy pillars DP1 and DP2, or DP1, DP2 and DPe may penetrate the capping insulation pattern 155a, each pad 133p, 135p or 137p, and the electrode structure ES disposed under each pad 133p, 135p or 137p. The number of the dummy pillars DP1 and DP2 penetrating one cell pad 135p may be equal to the number of the dummy pillars DP1 and DP2 penetrating another cell pad 135p. The number of the dummy pillars DP1 and DP2 penetrating the string selection pad 137p may be equal to or different from the number of the dummy pillars DP1 and DP2 penetrating each cell pad 135p. The number of the dummy pillars DP1, DP2 and DPe penetrating the ground selection pad 133p may be equal to or different from the number of the dummy pillars DP1 and DP2 penetrating each cell pad 135p.

Common source regions CS may be formed in the substrate 100 under spaces between the electrode structures ES. The substrate 100 may be doped with dopants of a first conductivity type, and the common source regions CS may be doped with dopants of a second conductivity type different from the first conductivity type. A first insulating layer 140 may fill the spaces between electrode structures ES. In addition, the first insulating layer 140 may cover top surfaces of the electrode structures ES. The first insulating layer 140 may include, for example, at least one of a silicon oxide layer, a silicon nitride layer, or a silicon oxynitride layer.

Cell contact plugs 145 may be respectively connected to the cell pads 135p of each of the electrode structures ES in the second region 60. The cell contact plugs 145 may penetrate the first insulating layer 140, the capping insulation pattern 115a, and the insulating patterns 110a in the second region 60. A string selection contact plug 147 may be connected to the string selection pad 137p, and a ground selection contact plug 143 may be connected to the ground selection pad 133p. The string selection contact plug 147 may penetrate the first insulating layer 140 and the insulating pattern 110a disposed on the string selection pad 137p. The ground selection contact plug 143 may penetrate the first insulating layer 140, the capping insulation pattern 115a, and the insulating pattern 110a disposed on the ground selection pad 133p.

In some embodiments, as illustrated in FIG. 2, the dummy pillars DP1 and DP2 penetrating each cell pad 135p may be arranged to surround the cell contact plug 145 connected to each cell pad 135p when viewed from a plan view. In some embodiments, the dummy pillars DP1 and DP2 penetrating each cell pad 135p may be respectively disposed at vertices of a first imaginary polygon 10 when viewed from a plan view. In an embodiment, central points of the dummy pillars DP1 and DP2 penetrating each cell pad 135p may overlap with the vertices of the first imaginary polygon 10, respectively. For example, the first imaginary polygon 10 may be a hexagon as illustrated in FIG. 2. Thus, six dummy pillars DP1 and DP2 may surround the cell contact plug 145. The cell contact plug 145 connected to each cell pad 135p may be disposed at a central point of the first imaginary polygon 10 when viewed from a plan view.

As illustrated in FIGS. 1 and 2, the vertical patterns VP may include outer vertical patterns VP penetrating an edge region of the electrode structure ES in a plan view and inner vertical patterns VP penetrating a central region of the electrode structure ES in a plan view. In one embodiment, the outer vertical patterns VP may constitute outermost ones of the plurality of rows of the vertical patterns VP, and the inner vertical patterns VP may constitute inner ones of the plurality of rows of the vertical patterns VP. As illustrated in FIG. 2, neighboring vertical patterns VP surrounding each of the inner vertical patterns VP may be respectively disposed at vertices of a second imaginary polygon 20 when viewed from a plan view, and each of the inner vertical patterns VP may be disposed at a central point of the second imaginary polygon 20.

The number of sides of the second imaginary polygon 20 may be equal to the number of sides of the first imaginary polygon 10. For example, the second imaginary polygon 20 may be a hexagon like the first imaginary polygon 10. In some embodiments, a planar area of the first imaginary polygon 10 may be different from a planar area of the second imaginary polygon 20. In some embodiments, the planar area of the first imaginary polygon 10 may be greater than the planar area of the second imaginary polygon 20.

Referring to FIGS. 1 to 3, the dummy pillars DP1 and DP2 penetrating each cell pad 135p may include a first dummy pillar DP1 penetrating a boundary between each cell pad 135p and a pad 133p, 135p or 137p adjacent to each cell pad 135p and a second dummy pillar DP2 laterally spaced apart from the boundary. At this time, each cell pad 135p and the pad 133p, 135p or 137p adjacent thereto may share the first dummy pillar DP1. In some embodiments, one vertex of the first imaginary polygon 10 may overlap with the boundary. As illustrated in FIG. 2, each cell pad 135p may have a pair of the boundaries. When the first imaginary polygon 10 is the hexagon, the dummy pillars DP1 and DP2 penetrating the each cell pads 135p may include the first two dummy pillars DP1 and the second four dummy pillars DP2. In an embodiment, each cell pad 135p and both pads disposed at both sides of each cell pad 135p may share the first two dummy pillars DP1.

In some embodiments, the dummy pillars DP1 and DP2 penetrating the string selection pad 137p may also include a first dummy pillar DP1 penetrating a boundary between the string selection pad 137p and the cell pad 135p adjacent thereto and a second dummy pillar DP2 laterally spaced apart from the boundary. The string selection pad 137p may be disposed at an uppermost portion of the electrode structure ES, and thus, the string selection pad 137p may have one boundary. In some embodiments, the dummy pillars DP1 and DP2 penetrating the string selection pad 137p may be disposed at the vertices of the first imaginary polygon 10, respectively.

Figure 8:
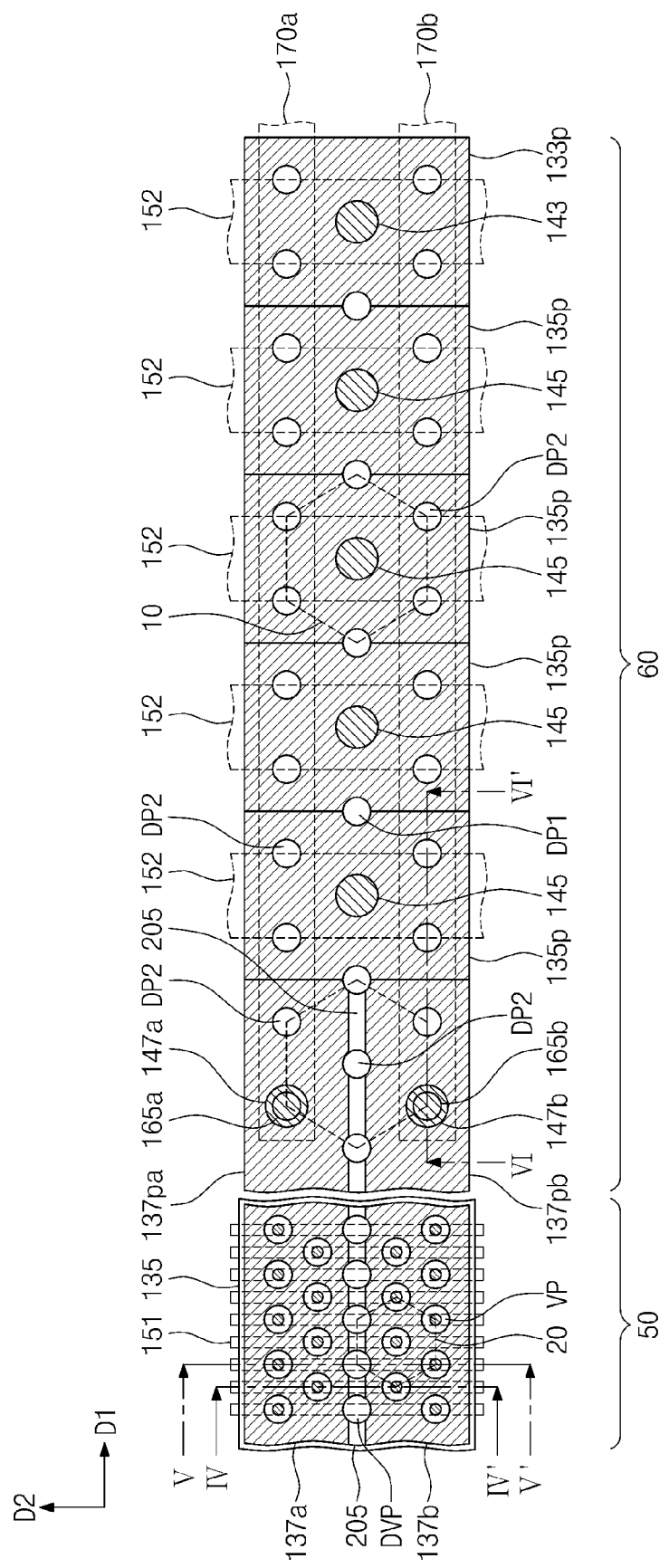
FIG. 8 is a plan view illustrating a 3D semiconductor device according to some embodiments of the inventive concepts.

The dummy pillars DP1, DP2 and DPe penetrating the ground selection pad 133p may include a first dummy pillar DP1 penetrating a boundary between the ground selection pad 133p and the cell pad 135p adjacent thereto, a second dummy pillar DP2 laterally spaced apart from the boundary, and an end dummy pillar DPe penetrating an end-side of the ground selection pad 133p opposite to the boundary. The dummy pillars DP1, DP2 and DPe penetrating the ground selection pad 133p may also be disposed at the vertices of the first imaginary polygon 10, respectively. In other embodiments, the end dummy pillar DPe may be omitted as illustrated in FIG. 8.

Referring to FIGS. 1 to 3, first interconnections 151 may be disposed on the first insulating layer 140 in the first region 50. The first interconnections 151 may extend in parallel along a second direction D2 perpendicular to the first direction D1. The vertical patterns VP penetrating each electrode structure ES may be electrically connected to the first interconnections 151, respectively. Each of the vertical patterns VP may be electrically connected to the first interconnection 151 through an interconnection plug 149 penetrating the first insulating layer 140. In some embodiments, the first interconnections 151 may correspond to bit lines, and the cell electrodes 135 may correspond to word lines. The ground selection electrode 133 may correspond to a ground selection line, and the string selection electrode 137 may correspond to a string selection line.

Second interconnections 152 may be disposed in parallel on the first insulating layer 140 in the second region 60. The second interconnections 152 may be electrically connected to the cell and ground selection contact plugs 145 and 143 of each electrode structure ES, respectively. In some embodiments, the first interconnections 151 and the second interconnections 152 may be disposed at the same level (or the same height) from the substrate 100, as illustrated in FIG. 3. However, the inventive concepts are not limited thereto. In other embodiments, the level (or height) of the first interconnections 151 may be different from that of the second interconnections 152. The various interconnections described herein, especially those which extend to an upper or lower surface of a device, may be referred to herein as terminals, or conductive terminals.

A second insulating layer 160 may be disposed on the first and second interconnections 151 and 152 and the first insulating layer 140. For example, the second insulating layer 160 may include at least one of a silicon oxide layer, a silicon nitride layer, or a silicon oxynitride layer. Upper interconnections 170 may be disposed on the second insulating layer 160 in the second region 60. The upper interconnections 170 may be electrically connected to the string selection contact plugs 147 of the electrode structures ES, respectively. The upper interconnection 170 may be electrically connected to the string selection contact plug 147 through an upper plug 165 penetrating the second insulating layer 160. In some embodiments, the upper interconnections 170 may extend in parallel along the first direction D2.

According to the 3D semiconductor device according to an embodiment of the inventive concept, the dummy pillars DP1, DP2 and DPe may penetrate the pads 133p, 135p and 137p constituting the stepped structure in the second region 20 so as to be connected to the substrate 100. Since the dummy pillars DP1, DP2 and DPe support the electrode structure ES, shape transformation of the electrode structure ES may be minimized or prevented. In one embodiment, the dummy pillars DP1, DP2 and DPe may support a mold stack structure during a replacement process for formation of the electrode structure ES, and thus, shape transformation of the pads 133p, 135p and 137p may be minimized or prevented. As a result, the 3D semiconductor device having excellent reliability may be realized.

In one embodiment, the first dummy pillar DP1, the second dummy pillar DP2, and the end dummy pillar DPe have the same structure and the same material as each other. In addition, the dummy pillars DP1, DP2 and DPe may include the same material as the vertical VP. Examples of the vertical pattern VP and the dummy pillar will be described with reference to FIGS. 4A to 4D. Hereinafter, the second dummy pillar DP2 will be described as a representative example of the dummy pillars DP1, DP2 and DPe.

Figure 4A:
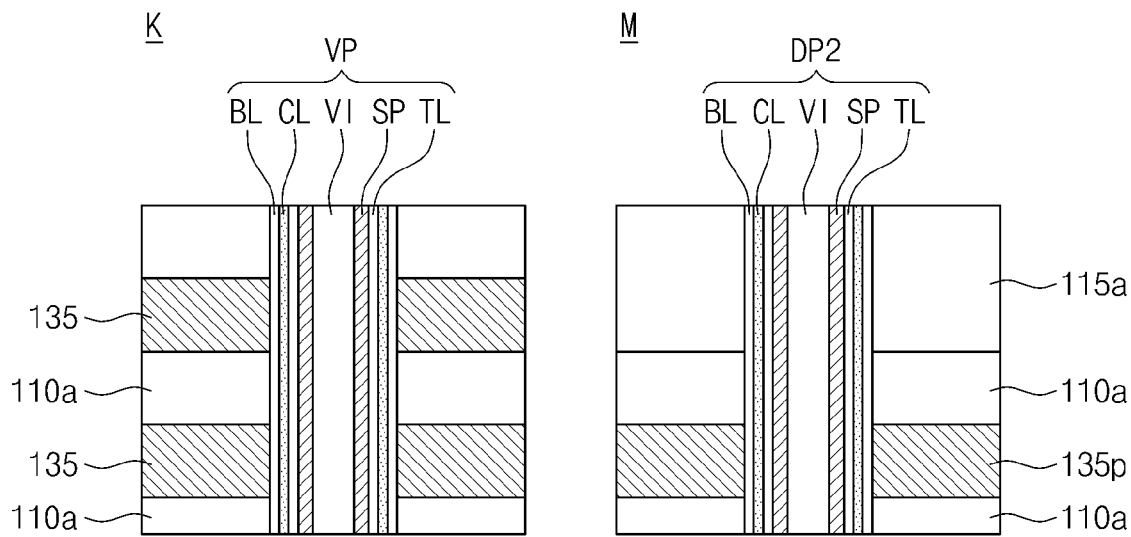
FIG. 4A is an enlarged view of 'K' and 'M' portions of FIG. 3 according to an exemplary embodiment of the inventive concept.

FIG. 4A is an enlarged view of 'K' and 'M' portions of FIG. 3 to illustrate an example of a vertical structure and an example of a dummy pillar of FIG. 3.

Referring to FIG. 4A, the vertical pattern VP may include a vertical semiconductor pattern SP extending upward from the substrate 100. A blocking insulating layer BL, a charge storage layer CL, and a tunnel insulating layer TL may be disposed between the cell electrode 135 and the vertical semiconductor pattern SP. The blocking insulating layer BL may be adjacent to the cell electrode 135, and the tunnel insulating layer TL may be adjacent to the vertical semiconductor pattern SP. The charge storage layer CL may be disposed between the blocking insulating layer BL and the tunnel insulating layer TL. For example, the tunnel insulating layer TL may include at least one of a silicon oxide layer and a silicon oxynitride layer. For example, the charge storage layer CL may include at least one of a silicon nitride layer including trap sites and an insulating layer including conductive nano dots. For example, the blocking insulating layer TL may include a high-k dielectric layer having a dielectric constant higher than that of the tunnel insulating layer TL. In an embodiment, the blocking insulating layer BL may further include a barrier insulating layer (e.g., a silicon oxide layer) having an energy band gap greater than that of the high-k dielectric layer.

In the present example, the blocking insulating layer BL, the charge storage layer CL, and the tunnel insulating layer TL vertically extend to cover a sidewall of the vertical semiconductor pattern SP. Thus, the vertical pattern VP according to the present example may include the blocking insulating layer BL, the charge storage layer CL, the tunnel insulating layer TL, and the vertical semiconductor pattern SP. In addition, the vertical semiconductor pattern SP may have a macaroni shape or a pipe shape. In this case, the vertical pattern VP may further include a vertical insulating pattern VI filling an inner region of the vertical semiconductor pattern SP. For example, the vertical insulating pattern VI may include silicon oxide.

As described above, the dummy pillar DP2 may include the same material as the vertical pattern VP. According to the present example, the dummy pillar DP2 may include the blocking insulating layer BL, the charge storage layer CL, the tunnel insulating layer TL, the vertical semiconductor pattern SP, and the vertical insulating pattern VI like the vertical pattern VP.

Figure 4B:
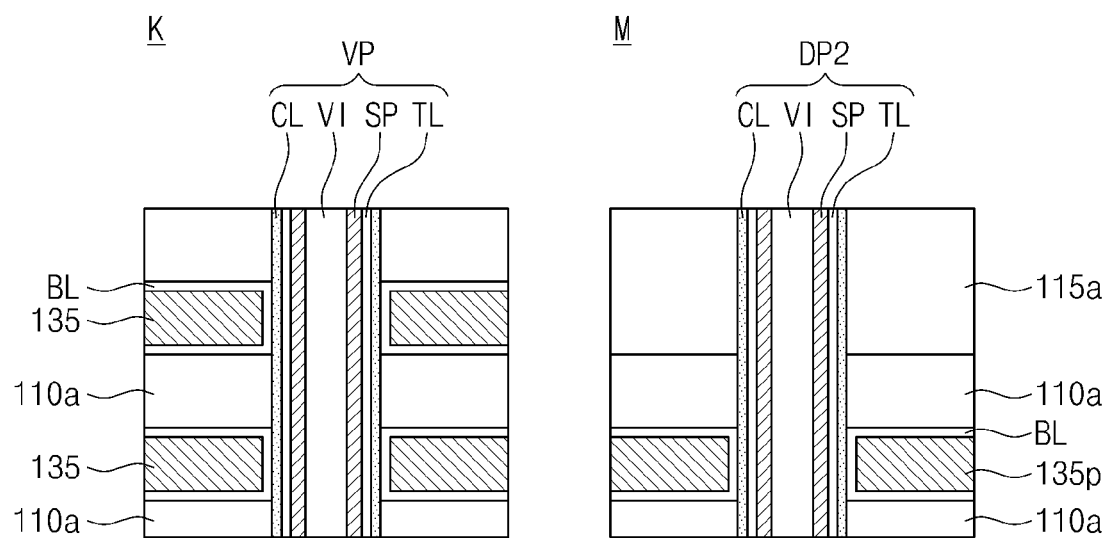
FIG. 4B is an enlarged view of 'K' and 'M' portions of FIG. 3 according to an exemplary embodiment of the inventive concept.

FIG. 4B is an enlarged view of 'K' and 'M' portions of FIG. 3 to illustrate another example of a vertical structure and another example of a dummy pillar of FIG. 3.

Referring to FIG. 4B, a vertical pattern VP according to the present example may consist of the charge storage layer CL, the tunnel insulating layer TL, the vertical semiconductor pattern SP, and the vertical insulating pattern VI. In this case, the blocking insulating layer BL may laterally extend to be disposed between the cell electrode 135 and between the insulating patterns 110a. In the present example, the dummy pillar DP2 may consist of the charge storage layer CL, the tunnel insulating layer TL, the vertical semiconductor pattern SP, and the vertical insulating pattern VI like the vertical pattern VP.

Figure 4C:
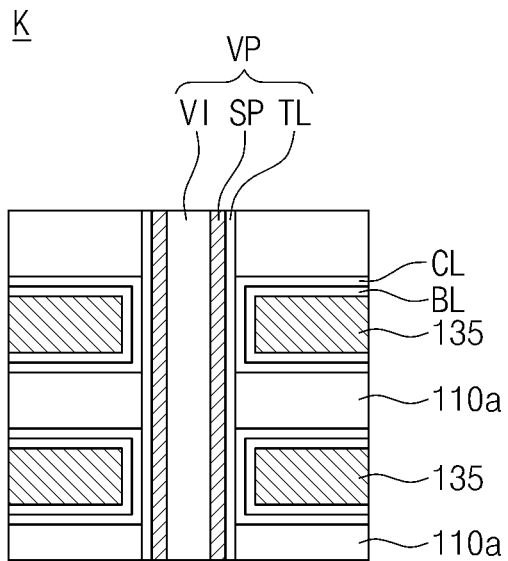
FIGS. 4C and 4D are enlarged views of a 'K' portion of FIG. 3 according to an exemplary embodiment of the inventive concept.
Figure 4D:
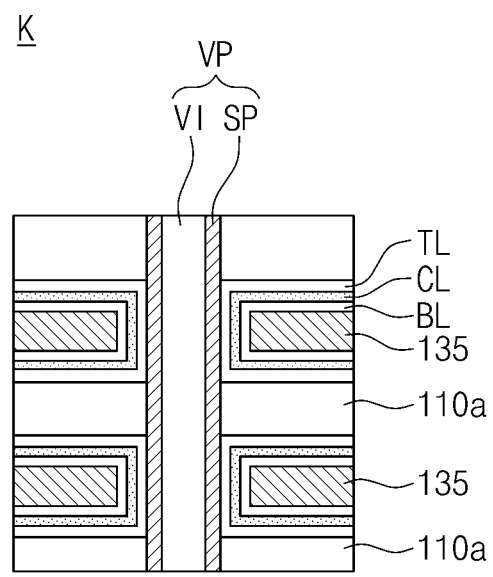

FIGS. 4C and 4D are enlarged views of a 'K' portion of FIG. 3 to illustrate other examples of a vertical structure of FIG. 3.

Referring to FIG. 4C, a vertical pattern VP according to the present example may consist of the tunnel insulating layer TL, the vertical semiconductor pattern SP, and the vertical insulating pattern VI. The blocking insulating layer BL and the charge storage layer CL may laterally extend to be disposed between the cell electrode 135 and the insulating patterns 110a. In this case, the dummy pillar may consist of the tunnel insulating layer TL, the vertical semiconductor pattern SP, and the vertical insulating pattern VI like the vertical pattern VP.

Referring to FIG. 4D, a vertical pattern VP according to the present example may consist of the vertical semiconductor pattern SP and the vertical insulating pattern VI. In the present example, the blocking insulating layer BL, the charge storage layer CL, and the tunnel insulating layer TL may laterally extend to be disposed between the cell electrode 135 and the insulating patterns 110a. In this case, the dummy pillar may consist of the vertical semiconductor pattern SP and the vertical insulating pattern VI.

Figure 5:
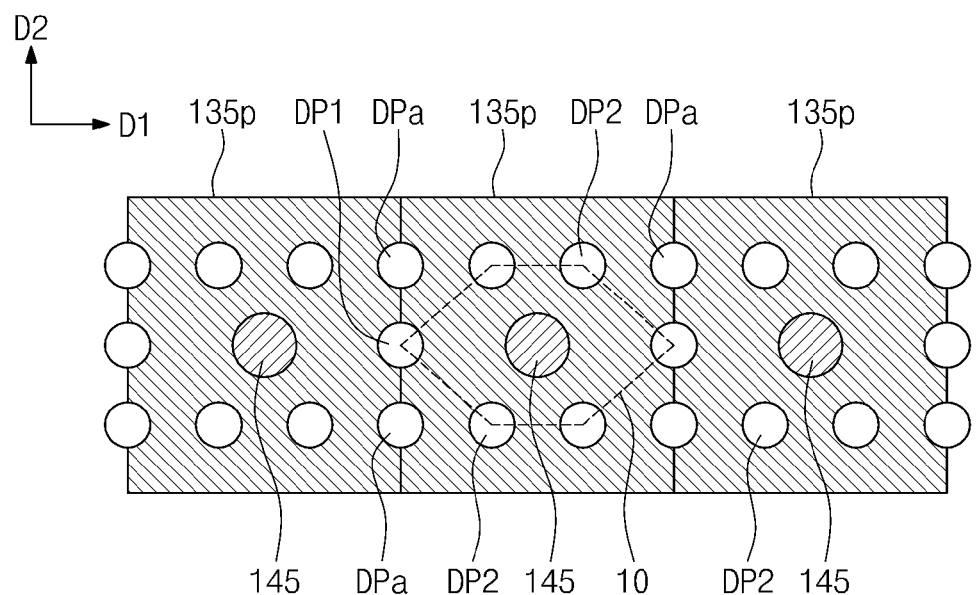
FIG. 5 is a plan view illustrating a 3D semiconductor device according to some embodiments of the inventive concepts.

FIG. 5 is a plan view illustrating a modified embodiment of a 3D semiconductor device according to some embodiments of the inventive concepts.

Referring to FIG. 5, in the present modified embodiment, dummy pillars penetrating each cell pad 135p may include the dummy pillars DP1 and DP2 respectively disposed at the vertices of the first imaginary polygon 10. One vertex of the first imaginary polygon 10 may overlap with the boundary between each cell pad 135p and another cell pad 135 adjacent thereto. Thus, the first dummy pillar DP1 may penetrate the boundary. As described above, the second dummy pillar DP2 may be laterally spaced apart from the boundary. In addition, the dummy pillars penetrating each cell pad 135p may further include an additional dummy pillar DPa. The additional dummy pillar DPa may penetrate the boundary at a side of the first dummy pillar DP1 and may be aligned with the second dummy pillar DP2 in a longitudinal direction of the electrode structure, for example, the first direction D1 of FIG. 1.

In some embodiments, the first imaginary polygon 10 may be a hexagon as illustrated in FIG. 5, and the dummy pillars penetrating each cell pad 135p may further include four additional dummy pillars DPa. Thus, these ten dummy pillars may form a rectangular shape. The cell pads 135p adjacent to each other may share the additional dummy pillar DPa as well as the first dummy pillar DP1.

Figure 6:
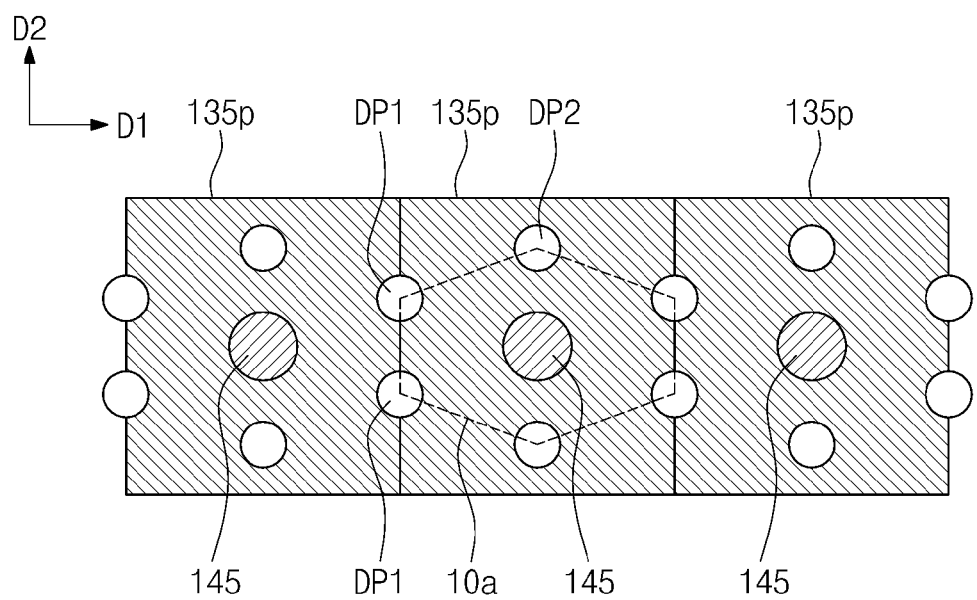
FIG. 6 is a plan view illustrating a 3D semiconductor device according to some embodiments of the inventive concepts.

FIG. 6 is a plan view illustrating another modified embodiment of a 3D semiconductor device according to some embodiments of the inventive concepts.

Referring to FIG. 6, when viewed from a plan view, the dummy pillars DP1 and DP2 penetrating each cell pad 135p may be respectively disposed at vertices of an imaginary polygon 10a and the cell contact plug 145 connected to each cell pad 135p may be disposed at a central point of the imaginary polygon 10a. In the present modified embodiment, one side of the imaginary polygon 10a may overlap with the boundary between the cell pads 135p adjacent to each other. Thus, first dummy pillars DP1 disposed at both vertices of the overlapping side may penetrate the boundary. Second dummy pillars DP2 penetrating the cell pad 135p are laterally spaced apart from the boundary.

Figure 7:
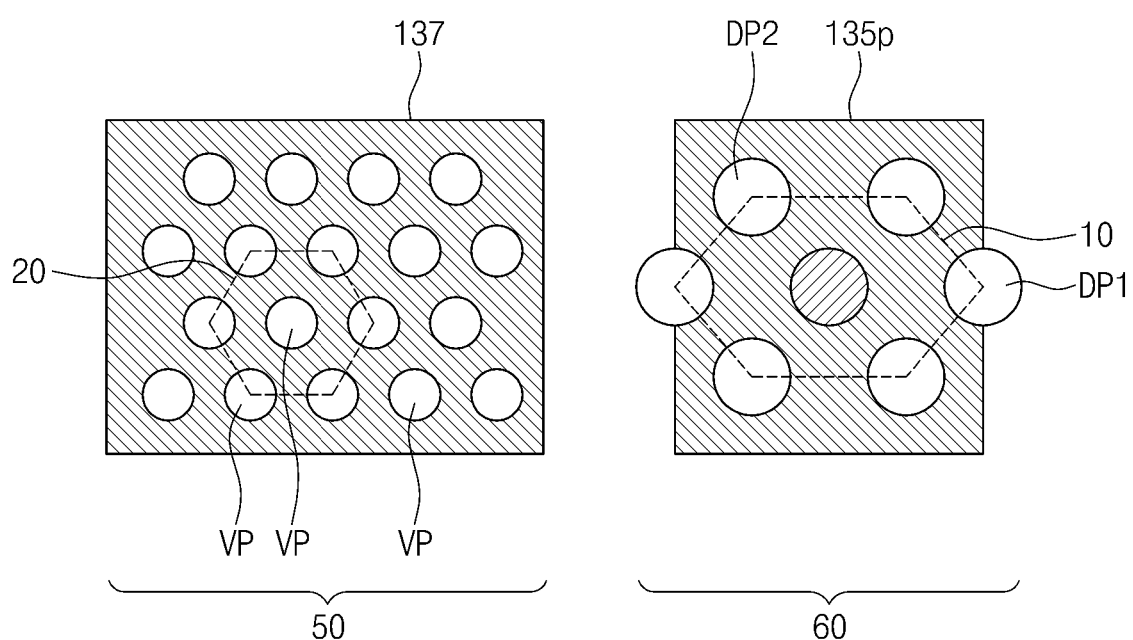
FIG. 7 is a plan view illustrating a 3D semiconductor device according to some embodiments of the inventive concepts.

On the other hand, an area of the top surface of each dummy pillar DP1, DP2 or DPe of FIGS. 1 to 3 may be substantially equal to an area of the top surface of the vertical pattern VP. However, the inventive concepts are not limited thereto. FIG. 7 is a plan view illustrating still another modified embodiment of a 3D semiconductor device according to some embodiments of the inventive concepts.

Referring to FIG. 7, in one embodiment, an area of a top surface of a dummy pillar DP1 or DP2 may be different from the area of the top surface of the vertical pattern VP. As illustrated in FIG. 7, the area of the top surface of the dummy pillar DP1 or DP2 may be greater than the area of the top surface of the vertical pattern VP. Alternatively, the area of the top surface of the dummy pillar DP1 or DP2 may be smaller than the area of the top surface of the vertical pattern VP. In some embodiments, the area of the top surface of the dummy pillar DP1 or DP2 may be in a range of 50% to 150% of the area of the top surface of the vertical pattern VP.

In FIGS. 1 to 3, the vertical patterns VP penetrating each electrode structure ES may constitute four rows, and each electrode structure ES may have one uppermost electrode (e.g., the string selection electrode). However, the inventive concepts are not limited thereto.

Figure 9:
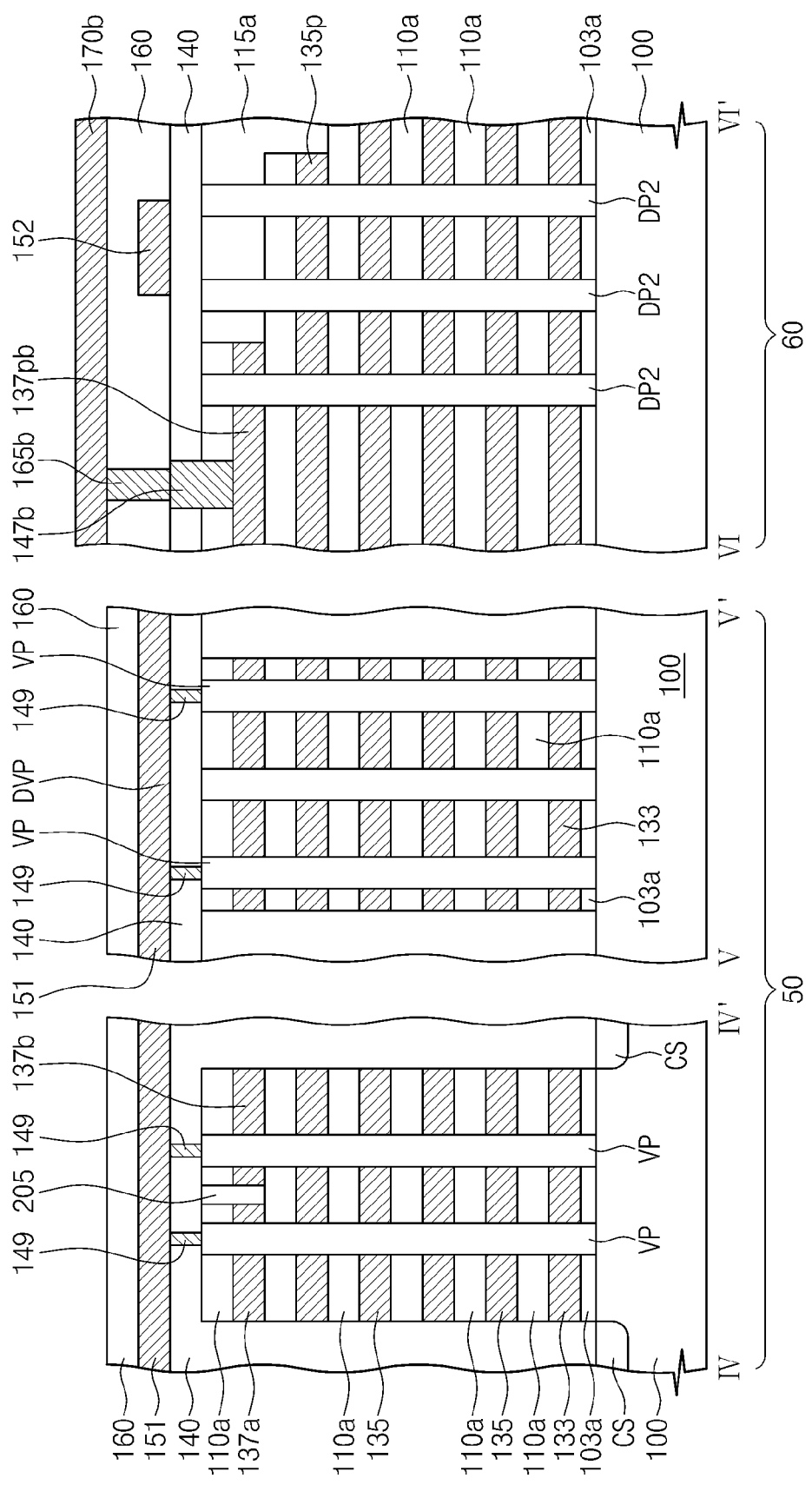
FIG. 9 is an exemplary cross-sectional view taken along lines IV-IV', V-V', and VI-VI' of FIG. 8.

FIG. 8 is a plan view illustrating yet another modified embodiment of a 3D semiconductor device according to some embodiments of the inventive concepts. FIG. 9 is a cross-sectional view taken along lines IV-IV', V-V', and VI-VI' of FIG. 8.

Referring to FIGS. 8 and 9, according to the present modified embodiment, an electrode structure may include a plurality of uppermost electrodes 137a and 137b. The uppermost electrodes 137a and 137b may be string selection electrodes 137a and 137b. In some embodiments, the plurality of uppermost electrodes 137a and 137b may include first and second string selection electrodes 137a and 137b. A cutting insulation pattern 205 may be disposed between the string selection electrodes 137a and 137b. In an embodiment, the string selection electrodes 137a and 137b may be separated from each other by the cutting insulation pattern 205. A bottom surface of the cutting insulation pattern 205 may be higher than a top surface of an uppermost cell electrode 135, so the plurality of string selection electrodes 137a and 137b may be disposed on one uppermost cell electrode 135. The cutting insulation pattern 205 may include, for example, silicon oxide.

The cutting insulation pattern 205 may extend from the first region 50 into the second region 60, and thus, first and second string selection pads 137pa and 137pb of the first and second string selection electrodes 137a and 137b may also be separated from each other by the cutting insulation pattern 205.

Vertical patterns VP and DVP may penetrate the electrode structure in the first region 50. In the present modified embodiment, the vertical patterns VP and DVP may constitute five rows parallel to the first direction D1. Vertical patterns constituting two rows adjacent to each other in the five rows may be arranged in a zigzag form along the first direction D1. Vertical patterns DVP constituting a central row of the five rows may overlap with the cutting insulation pattern 205. The vertical patterns DVP of the central row may be dummy vertical patterns DVP, and the vertical patterns VP constituting the others of the five rows may be cell vertical patterns VP.

The vertical patterns VP constituting outermost rows of the five rows are defined as outer vertical patterns, the vertical patterns VP and DVP constituting the others of the five rows are defined as inner vertical patterns. Each of the inner vertical patterns VP and DVP may be disposed at the central point of the second imaginary polygon 20, and neighboring vertical patterns VP and DVP surrounding each of the inner vertical patterns VP and DVP may be respectively disposed at the vertices of the second imaginary polygon 20.

First and second string selection contact plugs 147a and 147b may be connected to the first and second string selection pads 137pa and 137pb, respectively. In some embodiments, the first and second string selection contact plugs 147a and 147b may be respectively disposed at two vertices of an imaginary polygon when viewed from a plan view. Dummy pillars DP1 and DP2 penetrating the first and second string selection pads 137pa and 137pb may be disposed at a central portion and the others of the vertices of the imaginary polygon, respectively. First and second upper interconnections 170a and 170b may be electrically connected to the first and second string selection pads 137pa and 137pb through first and second upper plugs 165a and 165b penetrating the second insulating layer 160 of the second region 60, respectively.

In the first region 50, each of the first interconnections 151 may be electrically connected to the cell vertical patterns VP arranged in the second direction D2. At this time, the cell vertical patterns VP arranged in the second direction D2 may penetrate the first and second string selection electrodes 137a and 137b, respectively.

The inventive concepts are not limited to the modified embodiment illustrated in FIGS. 8 and 9. The number of the rows of the vertical patterns VP and DVP and the positions of the string selection contact plugs 147a and 147b may be variously modified.

FIGS. 10 to 16 are cross-sectional views taken along lines I-I', II-II', and III-III' of FIG. 1 to illustrate a method of manufacturing a 3D semiconductor device according to some embodiments of the inventive concepts. FIG. 17 is a plan view illustrating an example of an aperture of an illumination system used for forming holes of FIG. 12.

Figure 10:
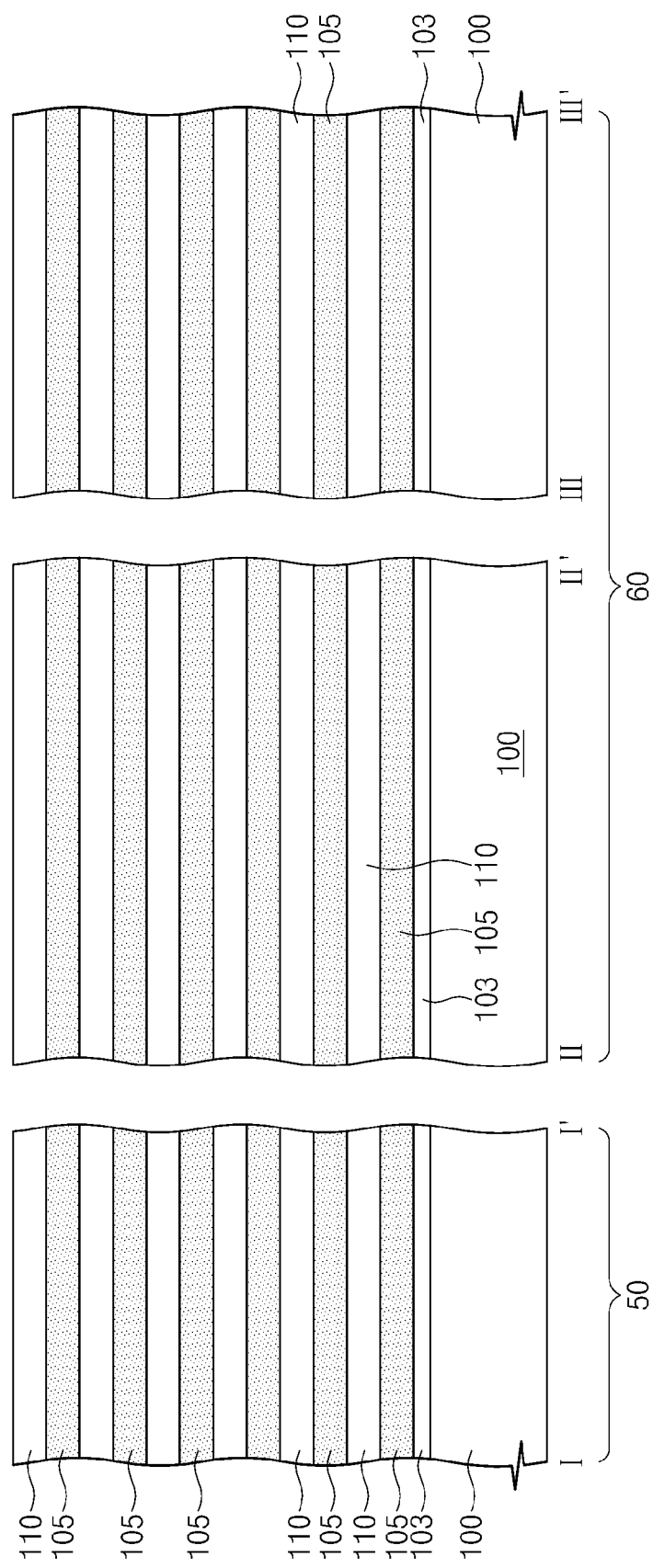
FIGS. 10 to 16 are cross-sectional views taken along lines I-I', II-II', and III-III' of FIG. 1 to illustrate a method of manufacturing a 3D semiconductor device according to some embodiments of the inventive concepts.

Referring to FIG. 10, a buffer insulating layer 103 may be formed on an entire top surface of a substrate 100 including a first region 50 and a second region 60. Sacrificial layers 105 and insulating layers 110 may be alternately formed on the substrate 100 having the buffer insulating layer 103. The sacrificial layers 105 may be formed of a material having an etch selectivity with respect to the buffer insulating layer 103 and the insulating layers 110. For example, the buffer insulating layer 103 and the insulating layers 110 may be formed of silicon oxide layers, and the sacrificial layers 105 may be formed of silicon nitride layers.

Figure 11:
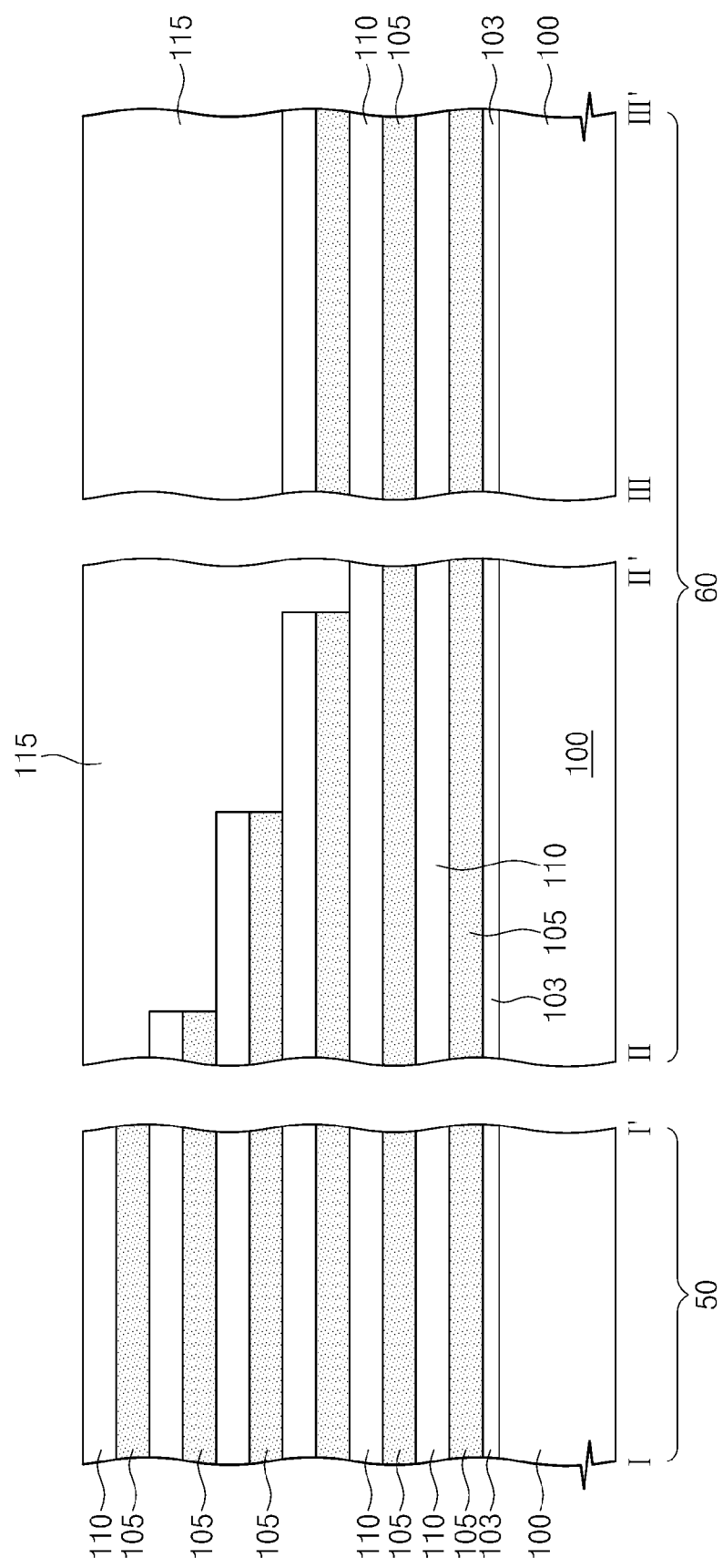

Referring to FIG. 11, the insulating layers 110 and the sacrificial layers 105 in the second region 60 may be patterned to form a stepped structure. In some embodiments, a mask pattern may be formed on an uppermost insulating layer 110, and the uppermost insulating layer 110 and an uppermost sacrificial layer 105 may be etched using the mask pattern as an etch mask to expose a next-uppermost insulating layer 110 in the second region 60. Subsequently, the mask pattern may be etched to reduce a width of the mask pattern. The next-uppermost insulating layer 110 and a next-sacrificial layer 105 may be etched using the etched mask pattern as an etch mask. The etching process of the insulating layer 110 and the sacrificial layer 105 and the etching process of the mask pattern may be repeatedly performed to form the stepped structure in the second region 60.

Next, a capping insulating layer 115 may be formed on the substrate 100, and the capping insulating layer 115 may be planarized. In some embodiments, the capping insulating layer 115 may be planarized until the uppermost insulating layer 110 of the first region 50 is exposed. In other embodiments, the planarized capping insulating layer 115 may remain on the uppermost insulating layer 110 of the first region 50.

Figure 12:
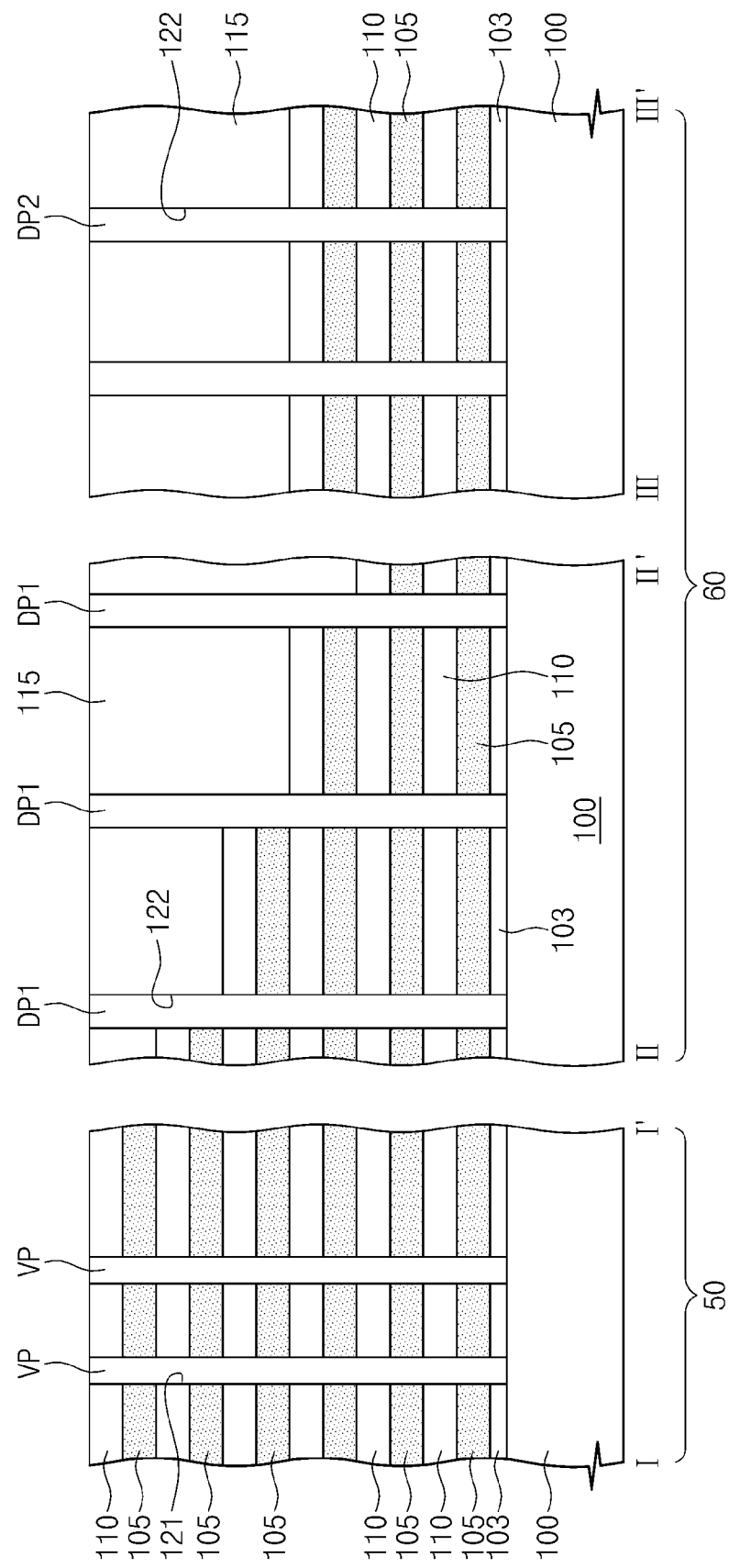

Referring to FIG. 12, the insulating layers 110, the sacrificial layers 105, and the buffer insulating layer 103 in the first region 50 may be successively patterned to form vertical holes 121. The capping insulating layer 115, the insulating layers 110, the sacrificial layers 105, and the buffer insulating layer 103 in the second region 60 may be successively patterned to form dummy holes 122.

The vertical holes 121 may be arranged as the vertical patterns VP described with reference to FIGS. 1 to 3. Likewise, the dummy holes 122 may be arranged as the dummy pillars DP1 and DP2 described with reference to FIGS. 1 to 3. Thus, the dummy holes 122 may be disposed at the vertices of the first imaginary polygon 10 of FIG. 2, respectively. The vertical holes 121 may be disposed at the vertices and the central point of the second imaginary polygon 20 of FIG. 2, respectively.

As described with reference to FIG. 2, the number of the sides of the first imaginary polygon 10 may be equal to the number of the sides of the second imaginary polygon 20. Thus, a process margin of a photolithography process defining the vertical and dummy holes 121 and 122 may be improved.

In one embodiment, the vertical holes 121 may be defined using an aperture having openings corresponding to the vertices of the second imaginary polygon 20 to improve the process margin of a photolithography process defining the vertical holes 121. For example, if the second imaginary polygon 20 is a hexagon, an aperture 190 may have openings 195 respectively corresponding to vertices of a hexagon as illustrated in FIG. 17. A remaining portion 192 of the aperture 190 may be formed of a light shielding material. If the second imaginary polygon 20 is the hexagon, the first imaginary polygon 10 is a hexagon. Thus, the dummy holes 122 may also be defined using the aperture 190 to improve the process margin of a photolithography process defining the dummy holes 122. As a result, even though the vertical holes 121 and the dummy holes 122 are defined using the aperture 190 at the same time, shapes of the vertical and dummy holes 121 and 122 may be easily controlled.

Next, vertical patterns VP may be formed in the vertical holes 121, respectively. Dummy pillars DP1 and DP2 may be formed in the dummy holes 122, respectively. The vertical patterns VP and the dummy pillars DP1 and DP2 may be formed at the same time. The vertical patterns VP and the dummy pillars DP1 and DP2 may be formed as one of the examples illustrated in FIGS. 4A to 4D.

Figure 13:
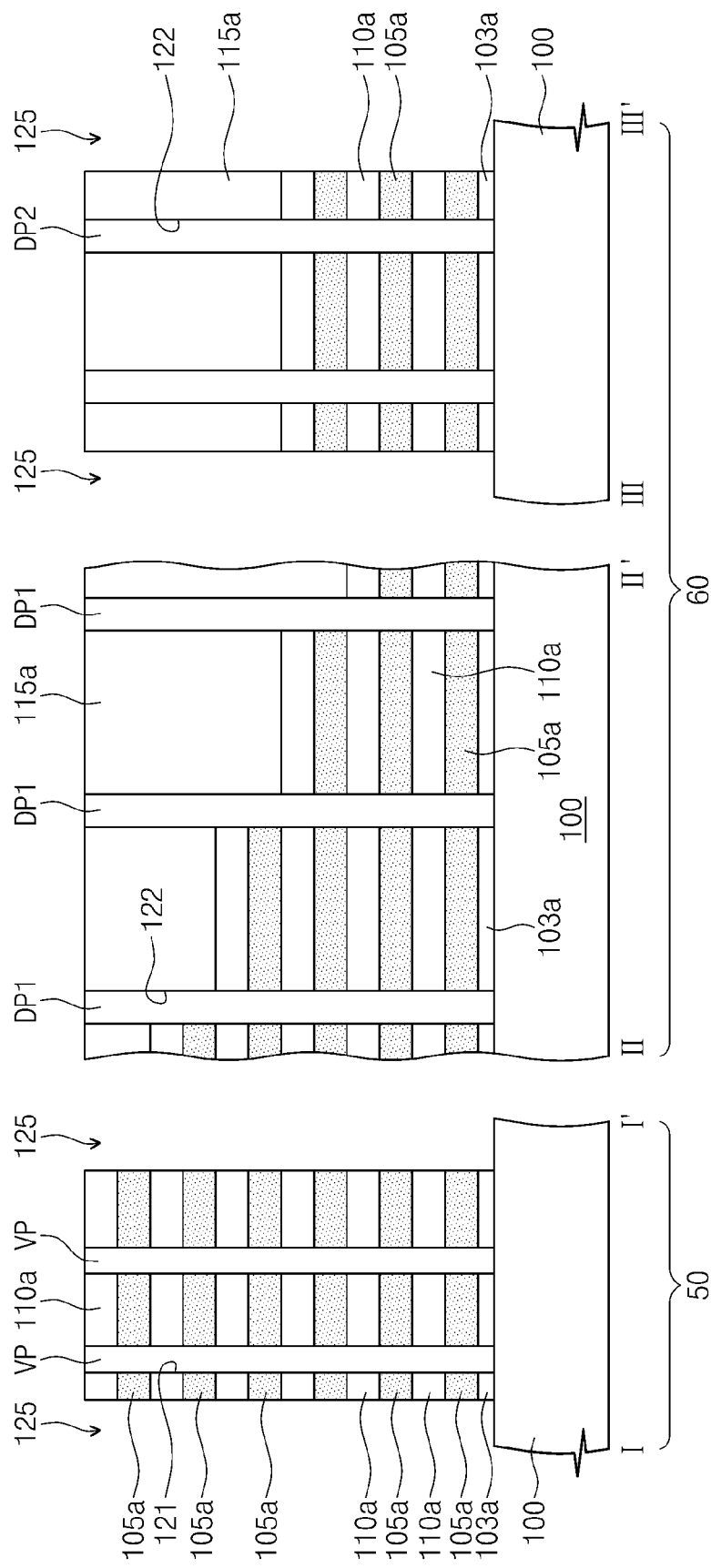

Referring to FIG. 13, the insulating layers 110, the sacrificial layers 105, the buffer insulating layer 104, and the capping insulating layer 115 may be patterned to form trenches 125 and a mold stack structure between the trenches 125. The trenches 125 may extend from the first region 50 into the second region 60, so the mold stack structure may also extend from the first region 50 into the second region 60. The mold stack structure may include insulating patterns 110a, sacrificial patterns 105a, a buffer insulating pattern 103a, and a capping insulation pattern 115a. The sacrificial patterns 105a and the insulating patterns 110a may be alternately stacked on the buffer insulating pattern 103a. The sacrificial patterns 105a may have sacrificial pads that constitute a stepped structure in the second region 60. The capping insulation pattern 115a may cover the sacrificial pads of the stepped structure in the second region 60. The vertical patterns VP and the dummy pillars DP1 and DP2 may penetrate the mold stack structure.

Subsequently, a replacement process may be performed on the sacrificial patterns 105a to form the electrode structure illustrated in FIGS. 1 to 3. This will be described in more detail with reference to FIGS. 14 and 15.

Figure 14:
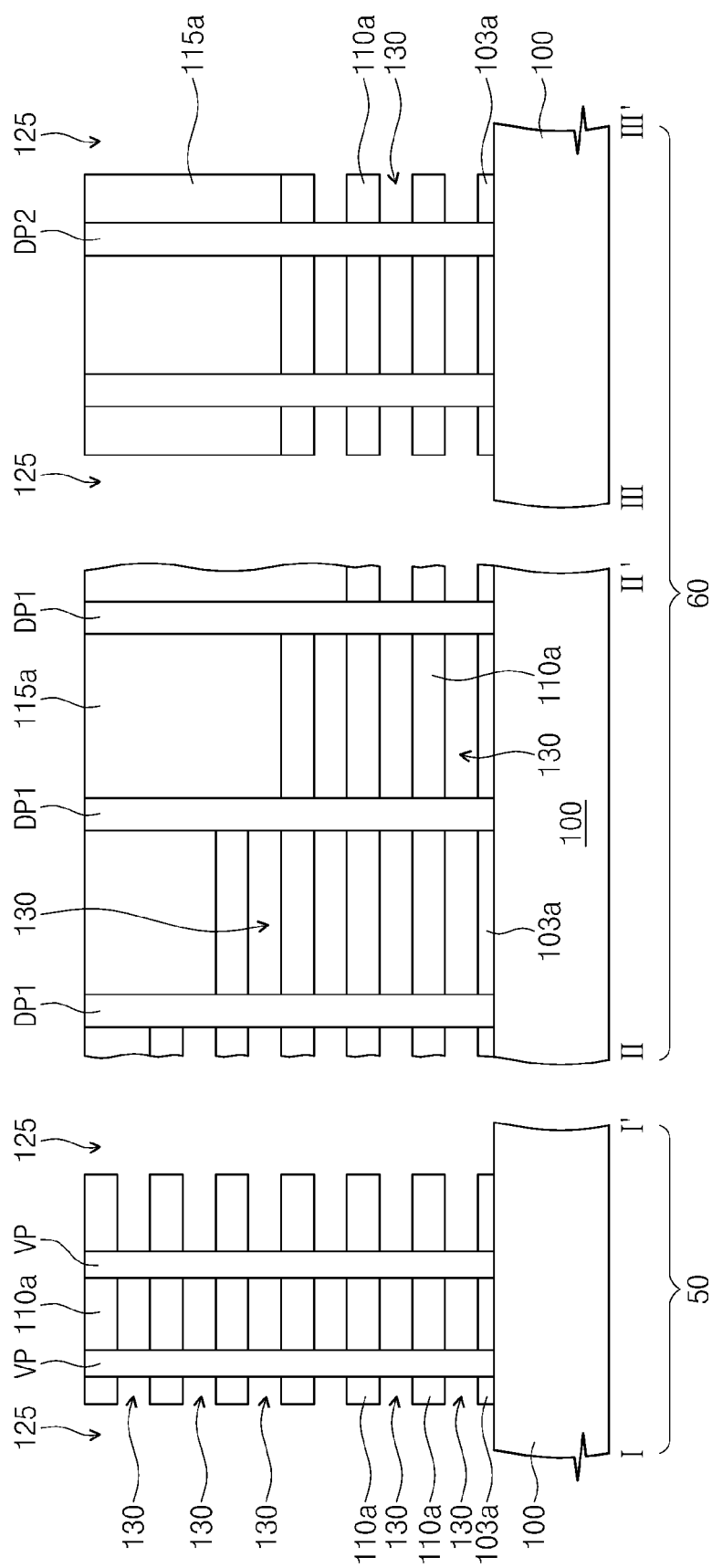

Referring to FIG. 14, the sacrificial patterns 105a exposed through the trenches 125 may be removed to form empty regions 130 between the insulating patterns 110a. The sacrificial patterns 105a may be removed using an isotropic etching process (e.g., a wet etching process).

When the sacrificial patterns 105a are removed, the dummy pillars DP1 and DP2 support the insulating patterns 110a and the capping insulation pattern 115a in the second region 60. In particular, a plurality of the dummy pillars DP1 and DP2 can support a region corresponding to each pad, and thus, various problems caused by the removal of the sacrificial patterns 105a may be minimized or prevented. For example, if the dummy pillars DP1 and DP2 do not exist, the insulating patterns 110a vertically adjacent to each other in the second region 60 may become close to or in contact with each other. In this case, shapes of the pads formed in a subsequent process may be distorted or at least a portion of the pads may not be formed. However, according to embodiments of the inventive concepts, the dummy pillars DP1 and DP2 support the insulating patterns 110a in the second region 60. Thus, the problems described above may be minimized or prevented.

The vertical patterns VP may support the insulating patterns 110a in the first region 50.

Figure 15:
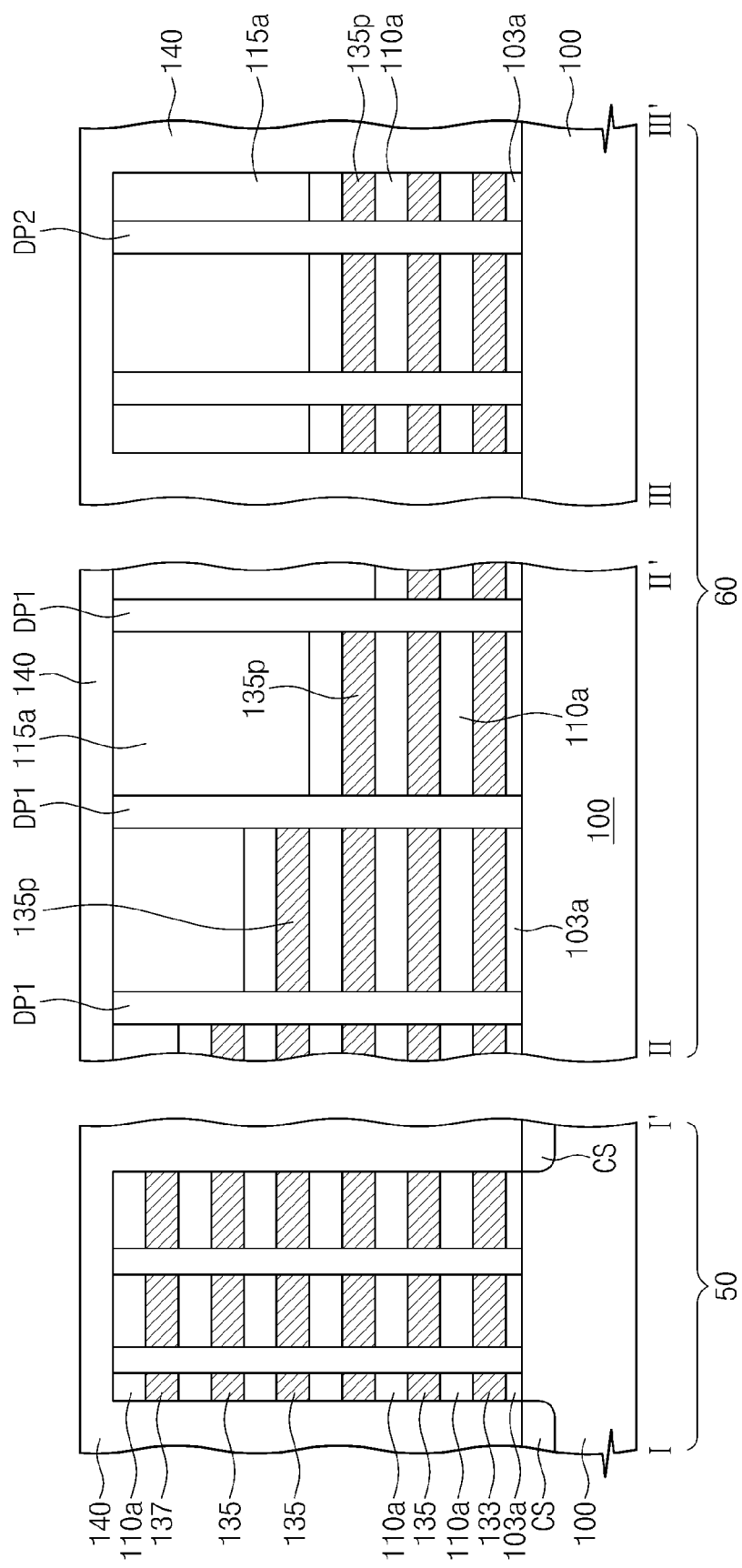

Referring to FIG. 15, a conductive layer filling the empty regions 130 may be formed on the substrate 100, and the conductive layer outside the empty regions 130 may be removed to form electrodes 133, 135 and 137 and pads 133p, 135p and 137p. When the vertical patterns VP and the dummy pillars DP1 and DP2 are formed as described with reference to FIG. 4B, the blocking insulating layer BL may be conformally formed in the empty regions 130 before the formation of the conductive layer. When the vertical patterns VP and the dummy pillars DP1 and DP2 are formed as described with reference to FIG. 4C, the charge storage layer CL and the blocking insulating layer BL may be sequentially formed in the empty regions 130 before the formation of the conductive layer. When the vertical patterns VP and the dummy pillars DP1 and DP2 are formed as described with reference to FIG. 4D, the tunnel insulating layer TL, the charge storage layer CL, and the blocking insulating layer BL may be sequentially formed in the empty regions 130 before the formation of the conductive layer.

Dopant ions may be implanted into the substrate 100 under the trenches 125 to form common source regions CS. The common source regions CS may be formed after the formation of the electrodes 133, 135 and 137. Alternatively, the common source regions CS may be formed after the formation of the trenches 125 and before the removal of the sacrificial patterns 105a.

A first insulating layer 140 may be formed on an entire top surface of the substrate 100. The first insulating layer 140 may fill the trenches 125. The first insulating layer 140 may cover the electrode structure.

Figure 16:
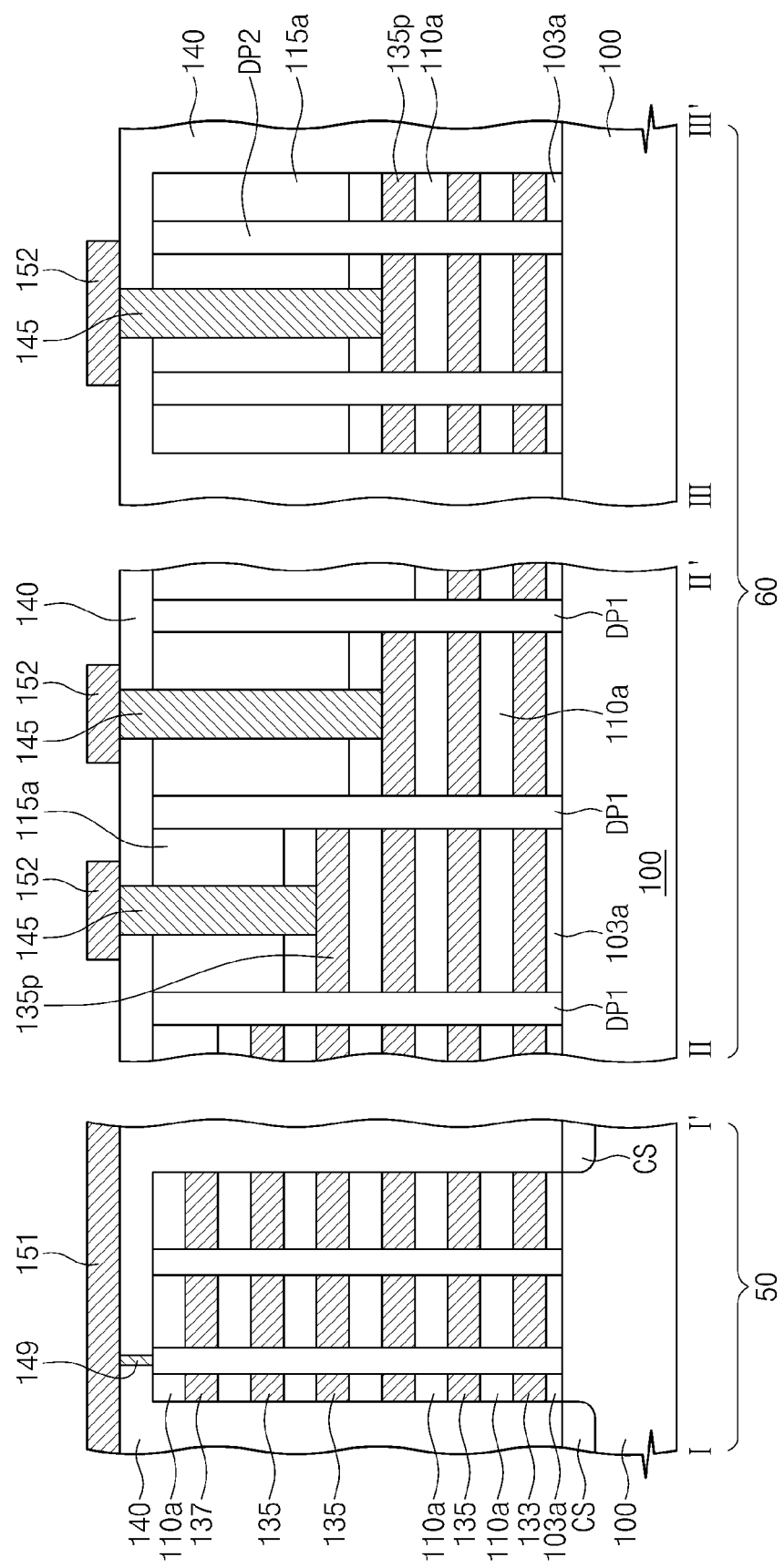
Figure 17:
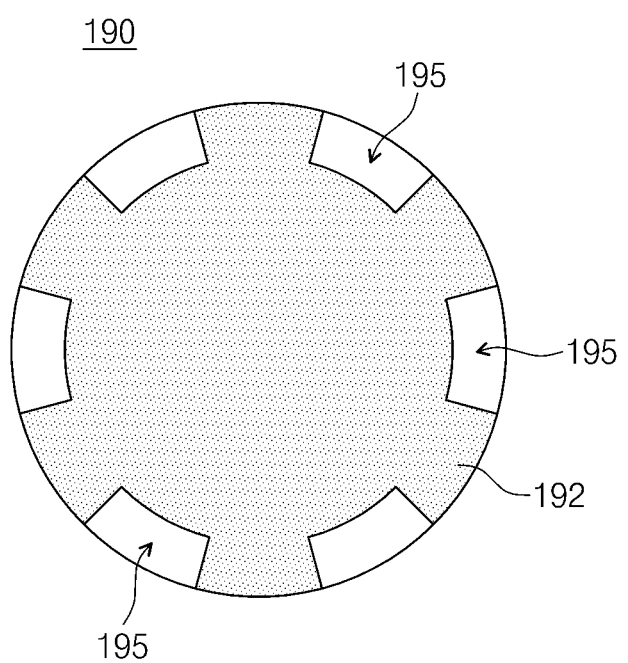
FIG. 17 is a plan view illustrating an example of an aperture of an illumination system used for forming holes of FIG. 12.

Referring to FIGS. 1 and 16, contact plugs 143, 145 and 147 respectively connected to the pads 133p, 135p and 137p may be formed in the second region 60. The contact plugs 143, 145 and 147 may penetrate the first insulating layer 140, the capping insulation pattern 115a, and the insulating patterns 110a. Interconnection plugs 149 may be formed to penetrate the first insulating layer 140 in the first region 50. The interconnection plugs 149 may be connected to top ends of the vertical patterns VP, respectively. The contact plugs 143, 145 and 147 and the interconnection plugs 149 may be formed of a conductive material and may be formed at the same time.

First interconnections 151 may be formed on the first insulating layer 140 in the first region 50, and second interconnections 152 may be formed on the second insulating layer 140 in the second region 60. The first interconnections 151 may be connected to the interconnection plugs 149. The second interconnections 152 may be connected to ground selection and cell contact plugs 143 and 145, respectively. The first and second interconnections 151 and 152 may be formed of a conductive material and may be formed at the same time.

Subsequently, the second insulating layer 160, upper plugs 165, and upper interconnections 170 of FIGS. 1 to 3 may be sequentially formed to realize the 3D semiconductor device of FIGS. 1 to 3.

In the aforementioned method of manufacturing the 3D semiconductor device, the dummy pillars DP1 and DP2 support the insulating patterns 110a in the second region 60 when the sacrificial patterns 105a are removed. Thus, transformation of the empty regions 130 of the second region 60 may be minimized or prevented. As a result, the 3D semiconductor device with excellent reliability may be realized.

FIGS. 18 to 21 are cross-sectional views taken along lines IV-IV', V-V', and VI-VI' of FIG. 8 to illustrate a method of manufacturing a 3D semiconductor device illustrated in FIGS. 8 and 9.

Figure 18:
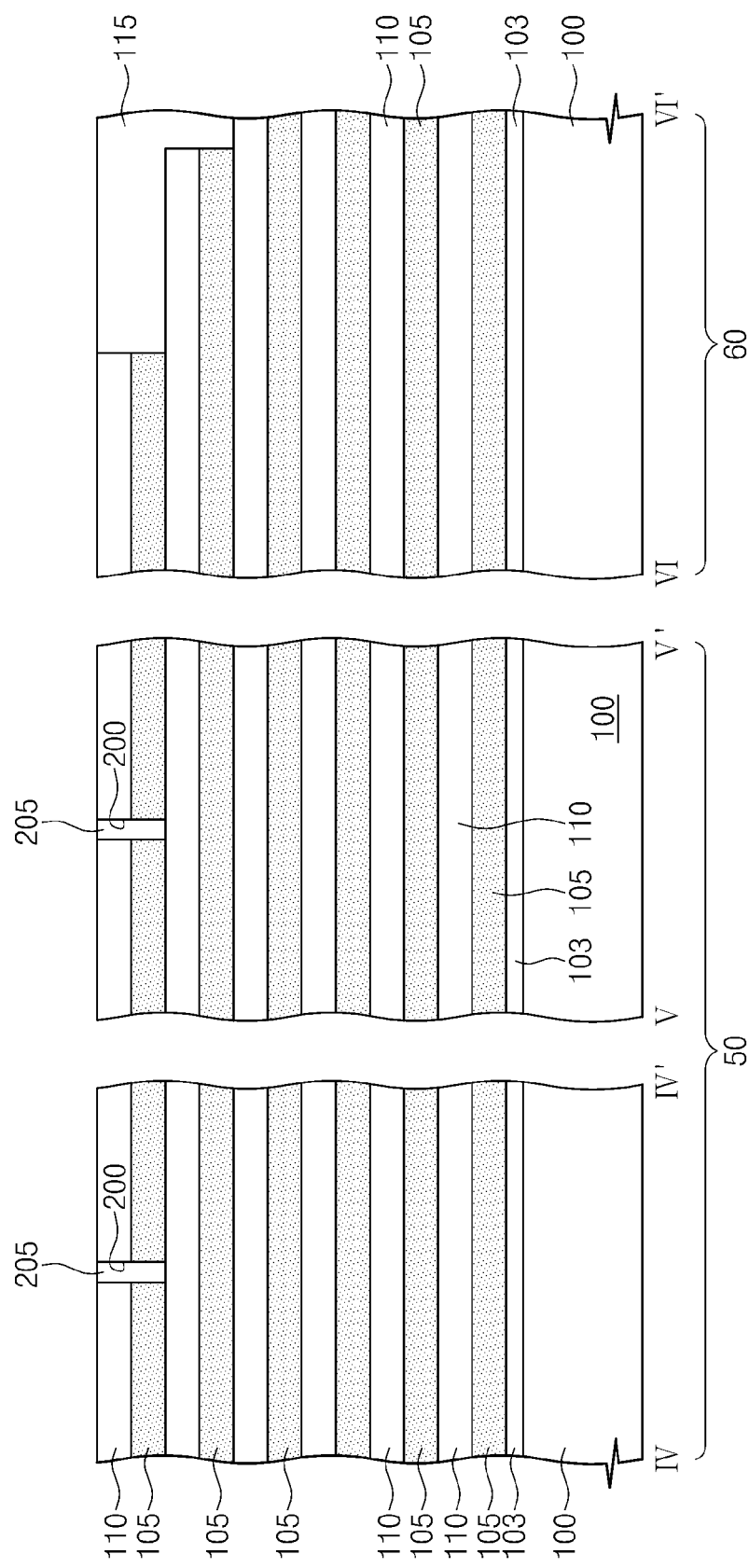
FIGS. 18 to 21 are cross-sectional views taken along lines IV-IV', V-V', and VI-VI' of FIG. 8 to illustrate an exemplary method of manufacturing a 3D semiconductor device illustrated in FIGS. 8 and 9.

Referring to FIG. 18, a buffer insulating layer 103 may be formed on a substrate 100 having first and second regions 50 and 60, and sacrificial layers 105 and insulating layers 110 may be alternately formed on the buffer insulating layer 103. The insulating layers 110 and the sacrificial layers 105 of the second region 60 may be patterned to form a stepped structure. A capping insulation layer 115 may be formed to cover the stepped structure.

An uppermost insulating layer 110 and an uppermost sacrificial layer 105 may be patterned to form a cutting region 200. The cutting region 200 may extend from the first region 50 into the second region 60. A cutting insulation pattern 205 may be formed to fill the cutting region 200. In some embodiments, the cutting region 200 and the cutting insulation pattern 205 may be formed after the formation of the stepped structure of the sacrificial layers 105 and the capping insulation layer 115. Alternatively, the stepped structure and the capping insulation layer 115 may be formed after the formation of the cutting region 200 and the cutting insulation pattern 205.

Figure 19:
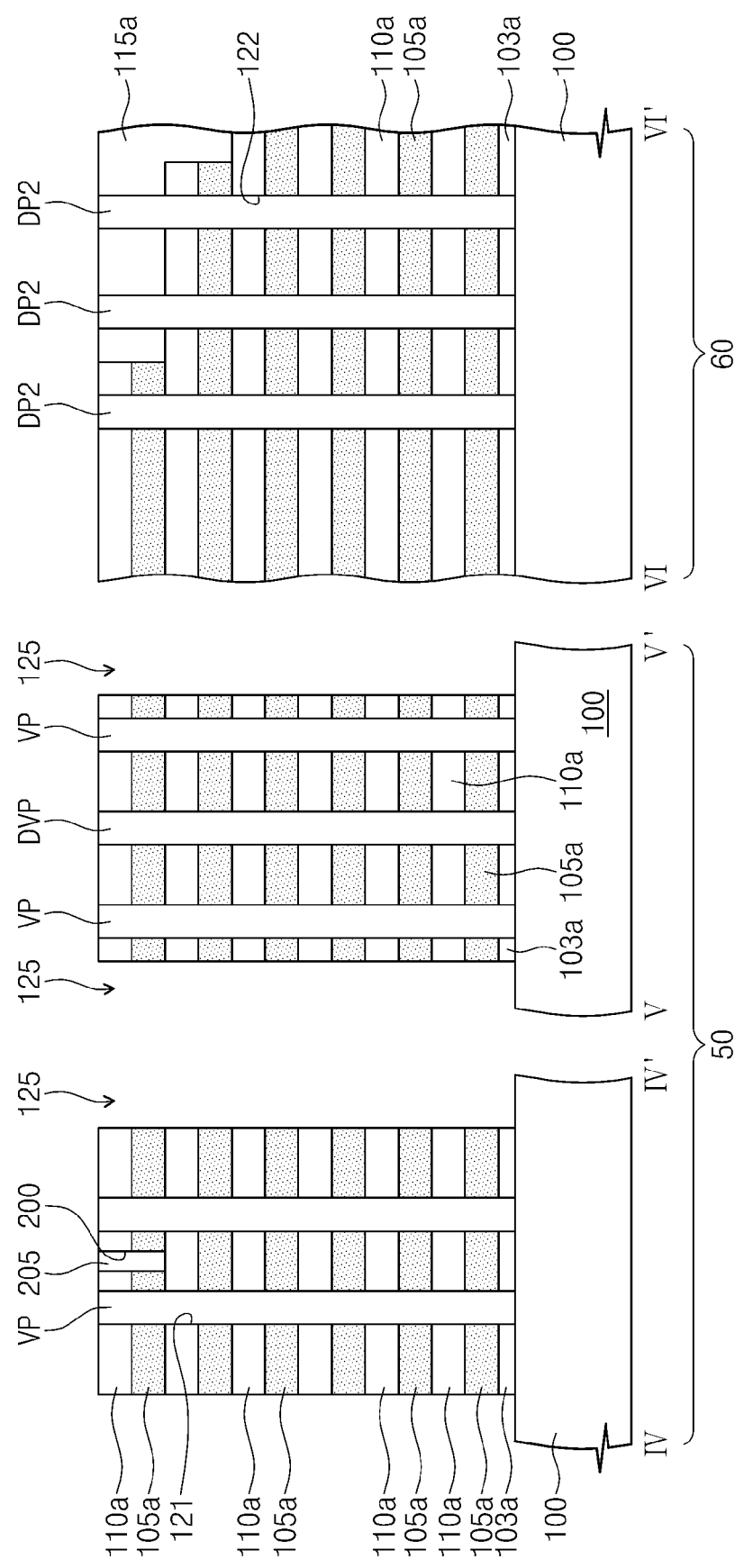

Referring to FIG. 19, the insulating layers 110, the sacrificial layers 105 and the buffer insulating layer 103 of the first region 50 may be patterned to form vertical holes 121. The capping insulation layer 115, the insulating layers 110, the sacrificial layers 105 and the buffer insulating layer 103 of the second region 60 may be patterned to form dummy holes 122. The vertical holes 121 may be arranged as the vertical patterns VP and DVP of FIGS. 8 and 9, and the dummy holes 122 may be arranged as the dummy pillars DP1 and DP2 of FIGS. 8 and 9. In some embodiments, the vertical holes 121 and the dummy holes 122 may be formed at the same time.

Vertical patterns VP and DVP may be formed in the vertical holes 121, respectively. Dummy pillars DP1 and DP2 may be formed in the dummy holes 122, respectively. The vertical patterns VP and DVP and the dummy pillars DP1 and DP2 may be formed as one of the examples of FIGS. 4A to 4D. The vertical patterns VP and DVP and the dummy pillars DP1 and DP2 may be formed at the same time.

The capping insulation layer 115, the insulating layers 110, the sacrificial layers 105, and the buffer insulating layer 103 may be patterned to form trenches 125 and a mold stack structure between the trenches 125. The mold stack structure may include a buffer insulating pattern 103a, sacrificial patterns 105a, insulating patterns 110a, and a capping insulation pattern 115a. The mold stack structure may include a plurality of uppermost sacrificial patterns 105a separated from each other by the cutting insulation pattern 205. In an embodiment, the cutting insulation pattern 205 may be disposed between the uppermost sacrificial patterns 105a included in one mold stack structure.

Figure 20:
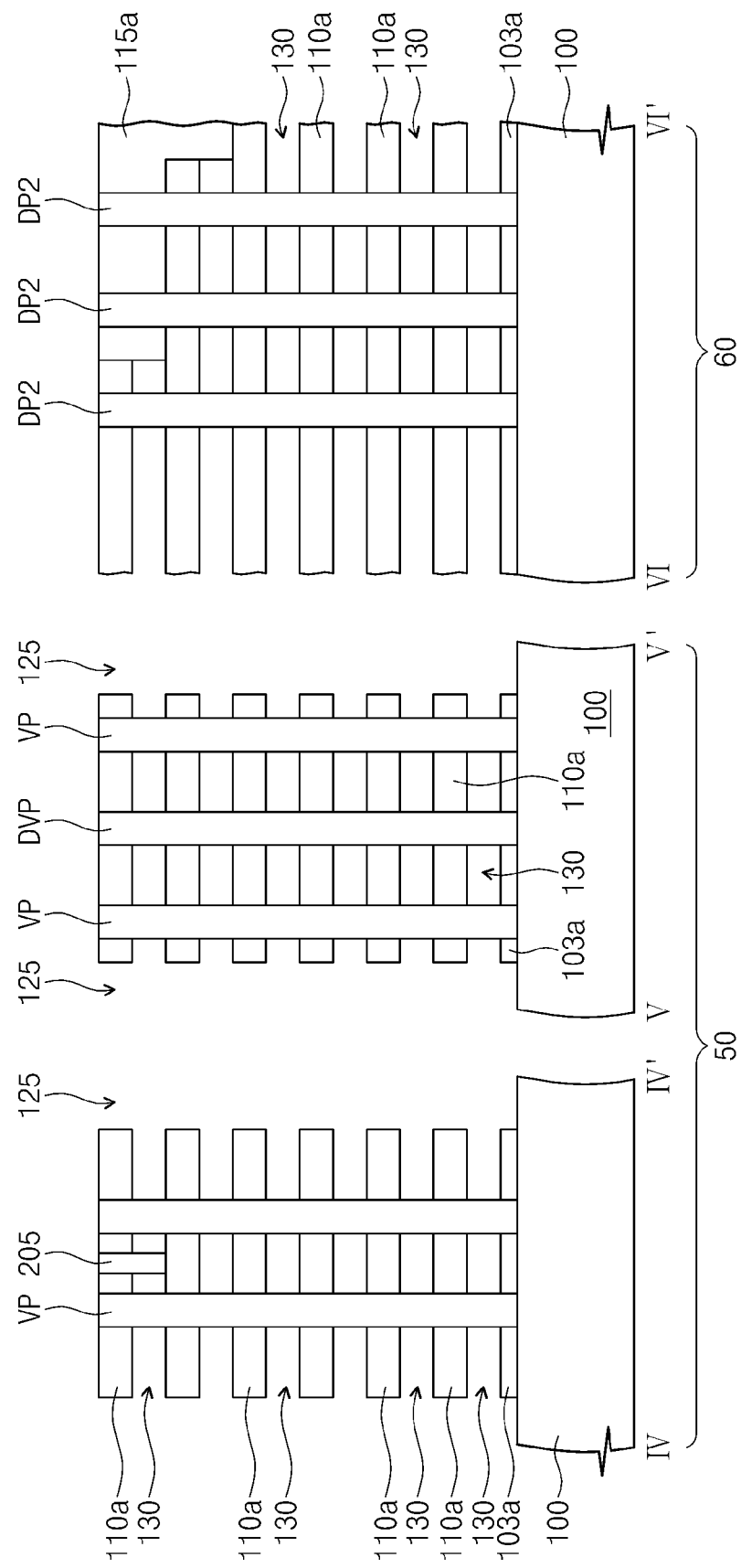

Referring to FIG. 20, the sacrificial patterns 105a may be removed to form empty regions 130. At this time, the vertical patterns VP and DVP and the dummy pillars DP1 and DP2 may sufficiently support the insulating patterns 110a. A plurality of uppermost empty regions 130 respectively corresponding to the plurality of uppermost sacrificial patterns 105a may be formed in one mold stack structure.

Figure 21:
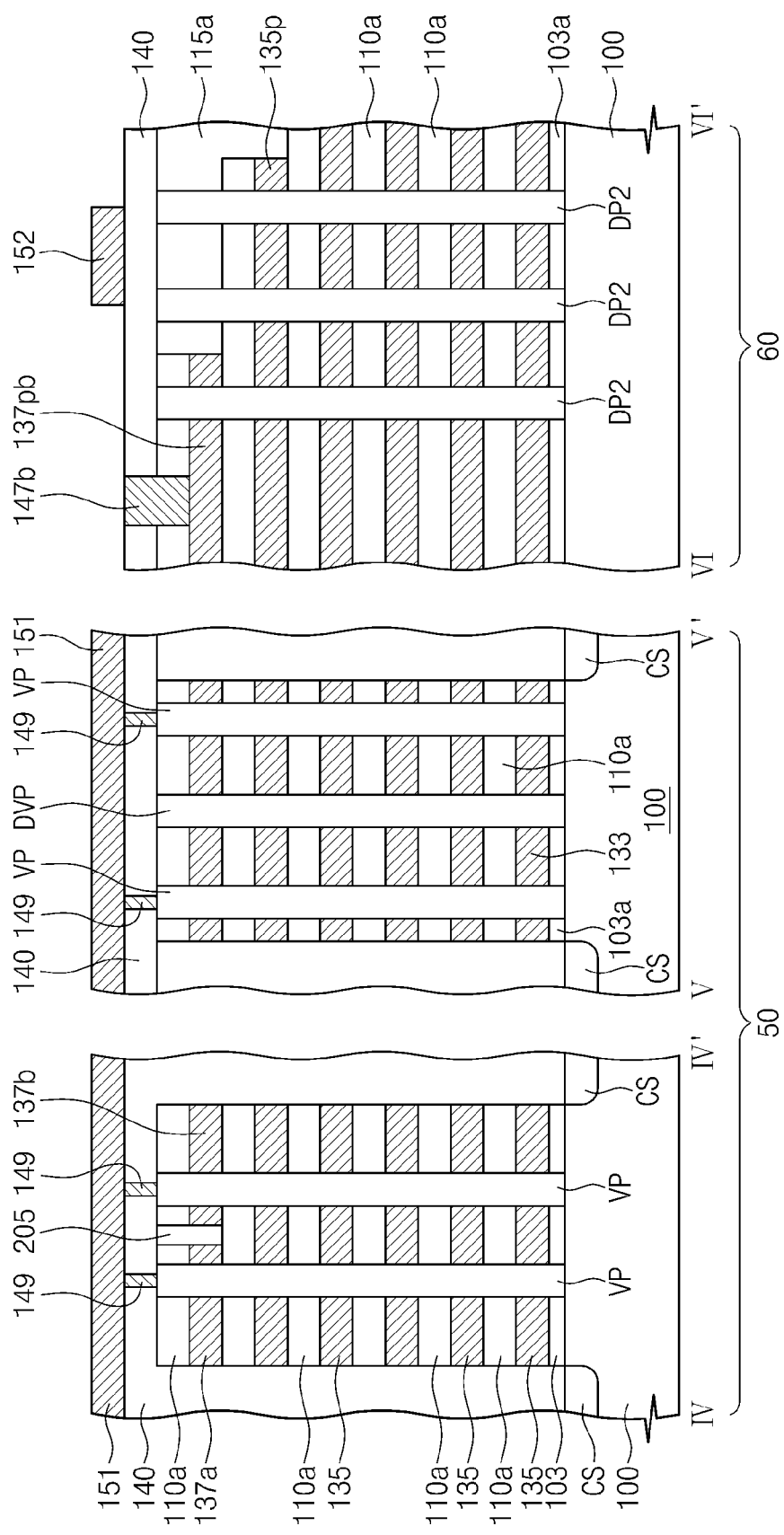

Referring to FIGS. 8 and 21, a conductive layer may be formed to fill the empty regions 103, and the conductive layer disposed outside the empty regions 130 may be removed to form electrodes 133, 135 and 137 and pads 133p, 135p, 137pa and 137pb. The pads 133p, 135p, 137pa and 137pb may be formed in the second region 60. As a result, an electrode structure may be formed.

First and second string selection electrodes 137a and 137b may be formed in the uppermost empty regions 130, respectively. The first and second string selection electrodes 137a and 137b may be laterally spaced apart from each other by the cutting insulation pattern 205. First and second string selection pads 137pa and 137pb of the first and second string selection electrodes 137a and 137b may also be laterally spaced apart from each other by the cutting insulation pattern 205.

Dopant ions may be implanted into the substrate 100 under the trenches 125 to form common source regions CS. A first insulating layer 140 may be formed to fill the trenches 125. The first insulating layer 140 may cover the electrode structure.

Interconnection plugs 149 may be formed to penetrate the first insulating layer 140 in the first region 50. The interconnection plugs 149 may be respectively connected to cell vertical patterns VP of the vertical patterns VP and DVP. In other words, the interconnection plugs 149 may not be formed on the dummy vertical patterns DVP.

Contact plugs 143, 145, 147a and 147b may be formed to penetrate the first insulating layer 140, the capping insulation pattern 115a and the insulating patterns 110a in the second region 60. The contact plugs 143, 145, 147a and 147b may be connected to the pads 133p, 135p, 137pa and 137pb, respectively.

First interconnections 151 may be formed on the first insulating layer 140 in the first region 50, and second interconnections 152 may be formed on the first insulating layer 140 in the second region 60. The first interconnections 151 may be connected to the interconnection plugs 149. The second interconnections 152 may be respectively connected to ground selection and cell contact plugs 143 and 145 of the contact plugs 143, 145, 147a and 147b.

Subsequently, the second insulating layer 160, the upper plugs 165a and 165b, and the upper interconnections 170a and 170b of FIGS. 8 and 9 may be, for example, sequentially formed to realize the 3D semiconductor device illustrated in FIGS. 8 and 9.

Next, a 3D semiconductor device according to other embodiments will be described. In the present embodiment, the same elements as described in the embodiments described above will be indicated by the same reference numerals or the same designators. For the purpose of ease and convenience in explanation, the descriptions to the same elements as described in the aforementioned embodiments will be omitted or mentioned briefly. An arrangement form of dummy pillars of the present embodiment may be different from that of the dummy pillars of the embodiments described above.

Figure 22:
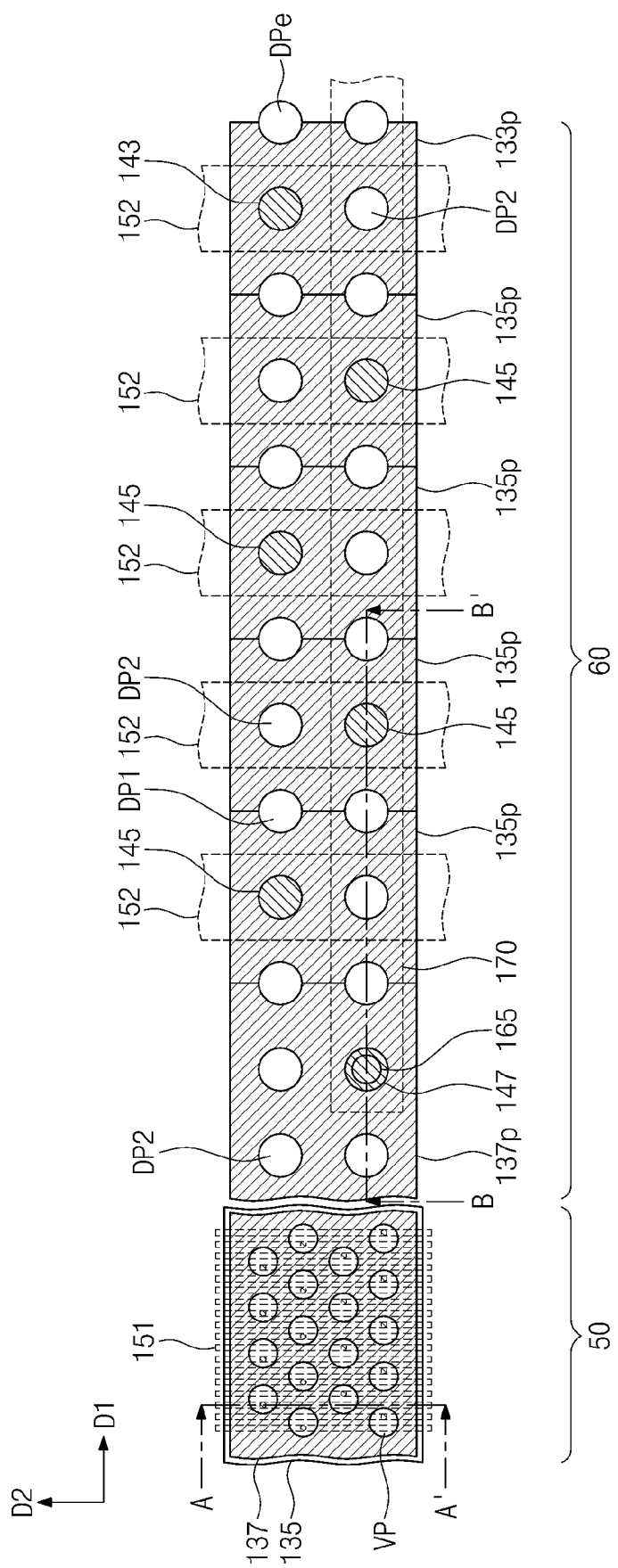
FIG. 22 is a plan view illustrating a 3D semiconductor device according to other embodiments of the inventive concepts.
Figure 23:
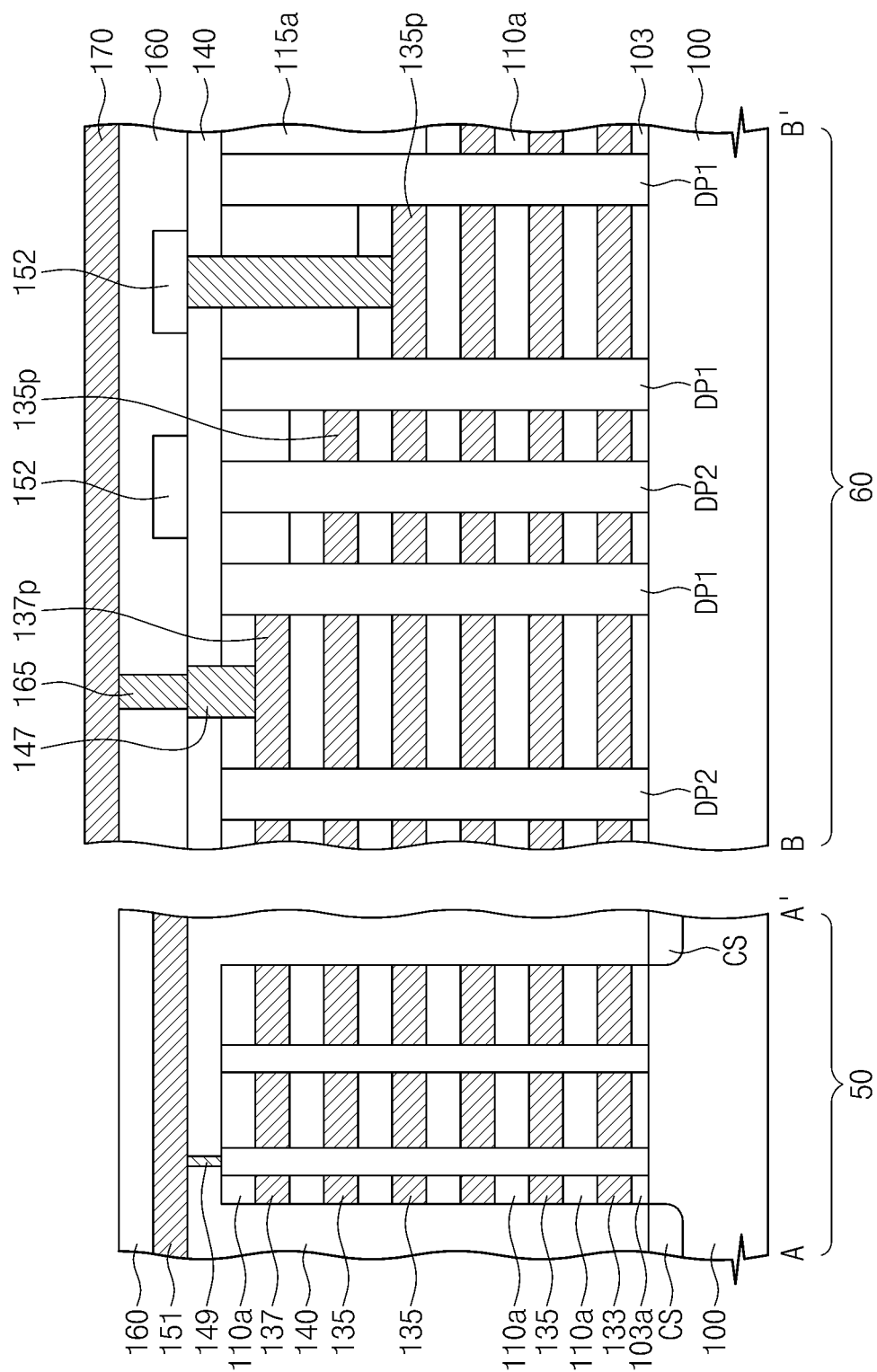
FIG. 23 is a cross-sectional view taken along lines A-A' and B-B' of FIG. 22, according to one embodiment of the inventive concept.

FIG. 22 is a plan view illustrating a 3D semiconductor device according to other embodiments of the inventive concepts. FIG. 23 is a cross-sectional view taken along lines A-A' and B-B' of FIG. 22.

Referring to FIGS. 22 and 23, an electrode structure including ground selection, cell and string selection electrodes 133, 135 and 137 sequentially stacked may be disposed on a substrate 100 of first and second regions 50 and 60. The electrode structure may include ground selection, cell and string selection pads 133p, 135p and 137p that constitute a stepped structure in the second region 60. Ground selection, cell and string selection contact plugs 143, 145 and 147 may be respectively connected to top surfaces of the ground selection, cell and string selection pads 133p, 135p and 137p in the second region 60.

Vertical patterns VP may penetrate the electrode structure in the first region 50 and may be connected to the substrate 100. In some embodiments, the vertical patterns VP may constitute four rows parallel to a first direction D1, as described with reference to FIGS. 1 to 3.

Dummy pillars DP1, DP2 and DPe may penetrate the electrode structure in the second region 60. The dummy pillars DP1, DP2 and DPe may be connected to the substrate 100. The dummy pillars DP1, DP2 and DPe may have the same structure and the same material as each other. As described in the aforementioned embodiment, the dummy pillars DP1, DP2 and DPe may include the same material as the vertical pattern VP. Dummy pillars DP1, DP2 and DPe may penetrate each pad 133p, 135p or 137p, a capping insulation pattern 115a disposed on each pad 133p, 135p or 137p, and the electrode structure disposed under each pad 133p, 135p or 137p.

The dummy pillars DP1 and DP2 penetrating each cell pad 135p may include a first dummy pillar DP1 and a second dummy pillar DP2. The first dummy pillar DP1 penetrates a boundary between each cell pad 135p and a pad 135p, 133p or 137p adjacent thereto. The second dummy pillar DP2 is laterally spaced apart from the boundary. The second dummy pillar DP2 is also spaced apart from sidewalls of each cell pad 135*p*. Each cell pad 135*p* and the pad 135*p*, 133*p* or 137*p* adjacent thereto may share the first dummy pillar DP1.

As illustrated in FIG. 22, the cell contact plug 145 connected to each cell pad 135*p* may be aligned with the first dummy pillar DP1 in a longitudinal direction (i.e., the first direction) of the electrode structure and may be aligned with the second dummy pillar DP2 in the second direction D2 perpendicular to the first direction D1 when viewed from a plan view. In some embodiments, the second dummy pillar DP2 may be aligned with another first dummy pillar DP1 in the first direction D1. In some embodiments, three sides of the cell contact plug 145 connected to each cell pad 135*p* may be surrounded by the dummy pillars DP1 and DP2 penetrating each cell pad 135*p*, as illustrated in FIG. 22.

When viewed from a plan view, the dummy pillars DP1, DP2 and DP2 and the contact plugs 143, 145 and 147 may constitute a plurality of rows along the first direction D1. For example, the contact plugs 143, 145 and 147 may be arranged in a zigzag form along the first direction D1.

A method of manufacturing the 3D semiconductor device according to the present embodiment may be the same as the method of manufacturing the 3D semiconductor device described with reference to FIGS. 10 to 16. However, in the manufacturing method, the dummy pillars DP1, DP2 and DPe may be arranged as illustrated in FIGS. 22 and 23.

As described above, the vertical patterns VP may constitute the four rows in the first region 50. However, the inventive concepts are not limited thereto.

Figure 24:
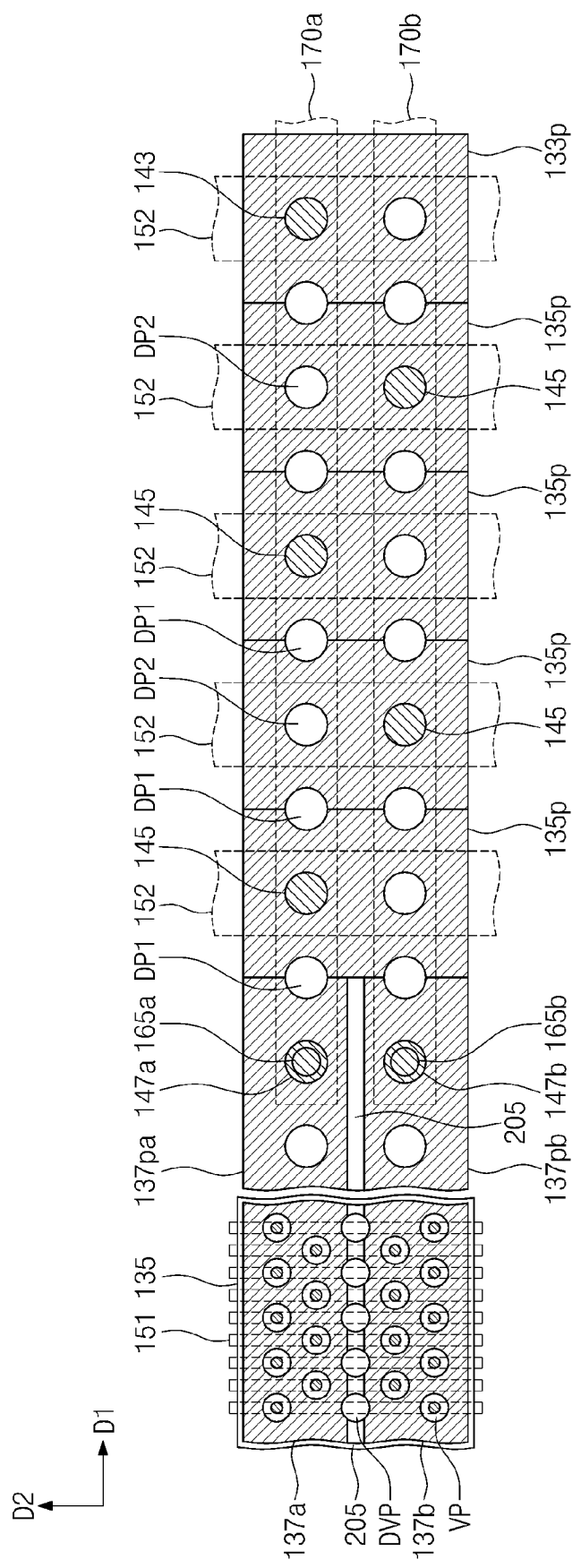
FIG. 24 is a plan view illustrating a 3D semiconductor device according to other embodiments of the inventive concepts.

FIG. 24 is a plan view illustrating a modified embodiment of a 3D semiconductor device according to other embodiments of the inventive concepts.

Referring to FIG. 24, in the present modified embodiment, first and second string selection electrodes 137*a* and 137*b* may be laterally spaced apart from each other in one electrode structure by a cutting insulation pattern 205, as described with reference to FIGS. 8 and 9. In addition, vertical patterns VP and DVP constituting five rows may penetrate the electrode structure in the first region 50, as described with reference to FIGS. 8 and 9.

The cutting insulation pattern 205 may laterally extend into the second region 60 to separate first and second string selection pads 137*pa* and 137*pb* of the first and second string selection electrodes 137*a* and 137*b* from each other. First and second string selection contact plugs 147*a* and 147*b* may be connected to the first and second string selection pads 137*pa* and 137*pb*, respectively. The first and second string selection contact plugs 147*a* and 147*b* may be electrically connected to first and second upper interconnections 170*a* and 170*b* through first and second upper plugs 165*a* and 165*b*, respectively.

A method of manufacturing the 3D semiconductor device according to the present modified embodiment may be the same as the method of manufacturing the 3D semiconductor device described with reference to FIGS. 18 to 21. However, in the manufacturing method, the dummy pillars DP1 and DP2 may be arranged as illustrated in FIG. 24.

Figure 25:
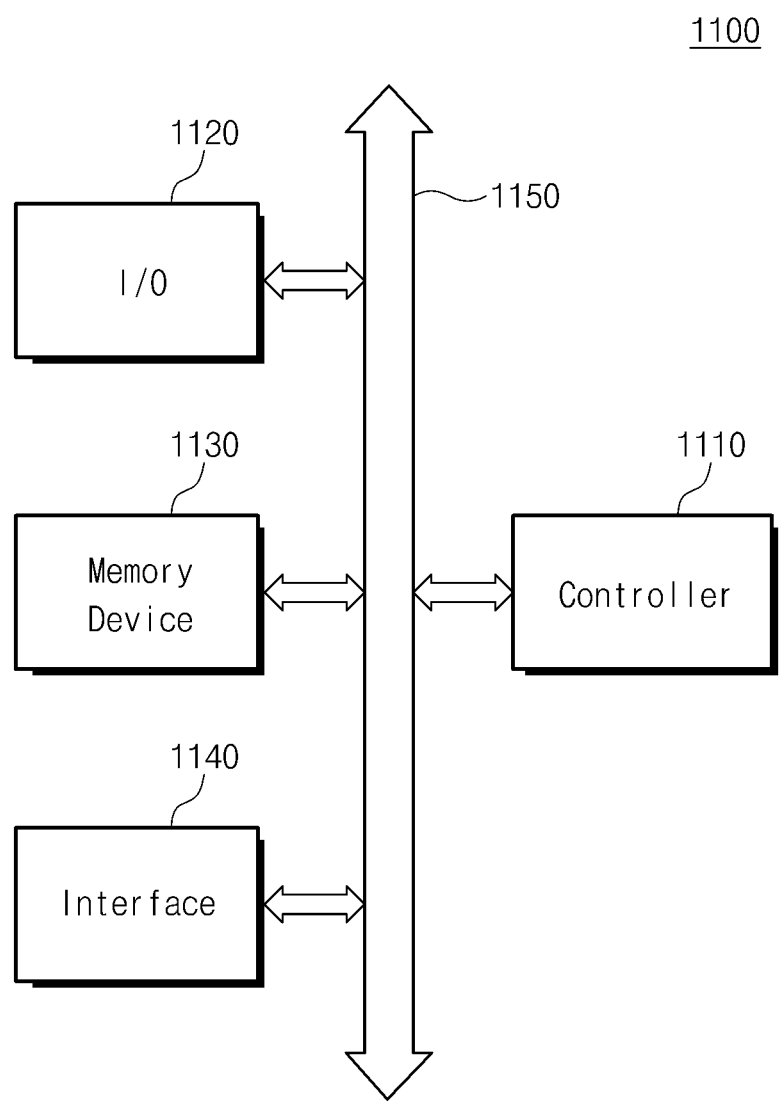
FIG. 25 is a schematic block diagram illustrating an example of electronic systems including 3D semiconductor devices according to embodiments of the inventive concepts.

FIG. 25 is a schematic block diagram illustrating an example of electronic systems including 3D semiconductor devices according to embodiments of the inventive concepts.

Referring to FIG. 25, an electronic system 1100 according to an embodiment of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device having a similar function to any one thereof. The I/O unit 1120 may include at least one of a keypad, a keyboard, or a display unit. The memory device 1130 may store data and/or commands. The memory device 1130 may include at least one of the 3D semiconductor devices according to the embodiments described above. The memory device 1130 may further include at least one of a magnetic memory device, a phase change memory device, a dynamic random access memory (DRAM) device, or a static random access memory (SRAM) device. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to an electronic device such as a personal digital assistant (PDA), a portable computer, a web tablet, a wireless phone, a mobile phone, a digital music player, a memory card, or other electronic products receiving or transmitting information data by wireless.

Figure 26:
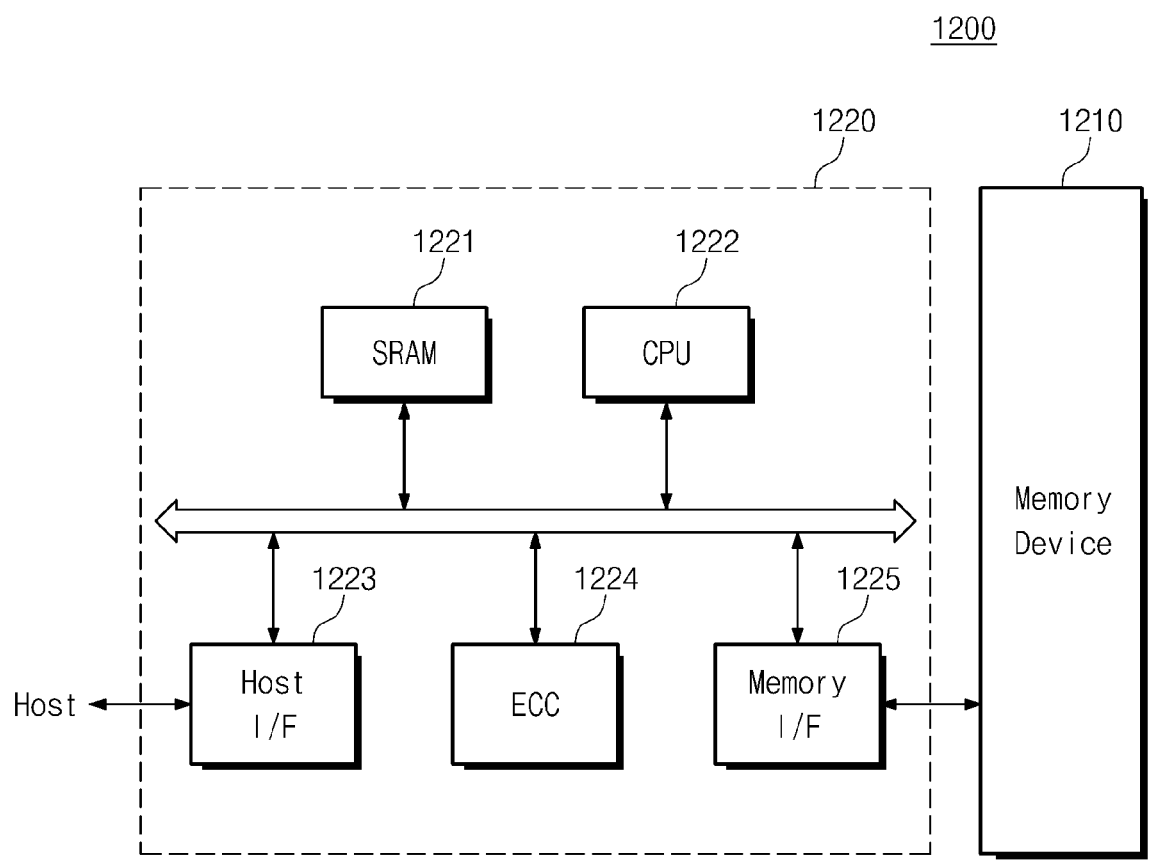
FIG. 26 is a schematic block diagram illustrating an example of memory cards including 3D semiconductor devices according to embodiments of the inventive concepts.

FIG. 26 is a schematic block diagram illustrating an example of memory cards including 3D semiconductor devices according to embodiments of the inventive concepts.

Referring to FIG. 26, a memory card 1200 according to an embodiment of the inventive concept may include a memory device 1210. The memory device 1210 may include at least one of the 3D semiconductor devices according to the embodiments mentioned above. In addition, the memory device 1210 may further include at least one of a magnetic memory device, a phase change memory device, a DRAM device, or a SRAM device. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include a SRAM device 1221 used as a working memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may be realized as solid state disks (SSD) which are used as hard disks of computer systems.

In the 3D semiconductor device described above, the dummy pillars penetrate each cell pad and the electrode structure disposed thereunder. Thus, the dummy pillars may support the pads of the electrode structure. In addition, the dummy pillars may support the mold stack structure during the replacement process for the formation of the electrode structure, and thus, shape transformation of the empty regions in which the pads are formed may be minimized or prevented. As a result, the 3D semiconductor devices having the excellent reliability may be realized.

While the present disclosure has been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A three-dimensional (3D) semiconductor device comprising:
    an electrode structure disposed on a substrate including a first region and a second region, the electrode structure comprising a ground selection electrode, a string selection electrode, and cell electrodes stacked between the ground and string selection electrodes, and the ground selection electrode, the cell electrodes, and the string selection electrode respectively including a ground selection pad, cell pads, and a string selection pad which constitute a stepped structure in the second region;
    a plurality of vertical patterns penetrating the electrode structure in the first region;
    a plurality of dummy pillars penetrating each of the cell pads and the electrode structure disposed under each of the cell pads; and
    a contact plug connected to each of the cell pads,
    wherein a dummy pillar of the dummy pillars penetrates at least a boundary between a cell pad of the cell pads and a pad adjacent thereto.

2. The 3D semiconductor device of claim 1, wherein each contact plug connected to a respective one of the cell pads is surrounded by a set of the dummy pillars when viewed from a plan view.

3. The 3D semiconductor device of claim 1, wherein the dummy pillars penetrating each of the cell pads comprise a second dummy pillar laterally spaced apart from the boundary, and
    wherein each contact plug connected to a respective one of the cell pads is aligned with a dummy pillar penetrating the boundary in a longitudinal direction of the electrode structure or is aligned with a second dummy pillar in a direction perpendicular to the longitudinal direction.

4. The 3D semiconductor device of claim 1, wherein each of the dummy pillars includes the same material as the vertical patterns.

5. The 3D semiconductor device of claim 1, wherein top surfaces of the dummy pillars are disposed at a substantially same level as top surfaces of the vertical patterns, and
    wherein bottom surfaces of the dummy pillars are disposed at a substantially same level as bottom surfaces of the vertical patterns.

6. The 3D semiconductor device of claim 1, wherein each of the vertical patterns comprises a vertical semiconductor pattern extending upward from the substrate, and
    wherein a tunnel insulating layer, a charge storage layer, and a blocking insulating layer are disposed between the vertical semiconductor pattern and each of the cell electrodes.

7. A three-dimensional (3D) semiconductor device comprising:
    an electrode structure disposed on a substrate including a first region and a second region, the electrode structure comprising a ground selection electrode, a string selection electrode, and cell electrodes stacked between the ground and string selection electrodes, and the ground selection electrode, the cell electrodes, and the string selection electrode respectively including a ground selection pad, cell pads, and a string selection pad which constitute a stepped structure in the second region;
    a plurality of vertical patterns penetrating the electrode structure in the first region;
    a plurality of dummy pillars penetrating each of the cell pads and the electrode structure disposed under each of the cell pads; and
    a contact plug connected to each of the cell pads,
    wherein a set of the dummy pillars penetrating each of the cell pads surround the contact plug connected to the respective cell pad when viewed from a plan view.

8. The 3D semiconductor device of claim 7, wherein the set of dummy pillars penetrating each respective cell pad comprise dummy pillars respectively disposed at vertices of a first imaginary polygon, and
    wherein the contact plug connected to each respective cell pad is disposed at a central point of the first imaginary polygon.

9. The 3D semiconductor device of claim 8, wherein the vertical patterns comprise: outer vertical patterns penetrating an edge region of the electrode structure in a plan view; and inner vertical patterns penetrating a central region of the electrode structure in a plan view,
    wherein each of the inner vertical patterns is disposed at a central point of a second imaginary polygon,
    wherein neighboring vertical patterns surrounding each of the inner vertical patterns are disposed at vertices of the second imaginary polygon, respectively, and
    wherein the number of sides of the first imaginary polygon is equal to the number of sides of the second imaginary polygon.

10. The 3D semiconductor device of claim 9, wherein an area of the first imaginary polygon is different from an area of the second imaginary polygon.

11. The 3D semiconductor device of claim 9, wherein each of the first and second imaginary polygons is a hexagon.

12. The 3D semiconductor device of claim 11, wherein the set of dummy pillars penetrating each respective cell pad comprise:
    a first dummy pillar penetrating a boundary between a respective cell pad and a pad adjacent thereto;
    a second dummy pillar laterally spaced apart from the boundary; and
    an additional dummy pillar penetrating the boundary at a side of the first dummy pillar and aligned with the second dummy pillar in a longitudinal direction of the electrode structure.

13. The 3D semiconductor device of claim 11, wherein one side of the first imaginary polygon overlaps with a boundary between each of cell pads and a pad adjacent thereto, and
    wherein the dummy pillars disposed at both vertices of the one side of the first imaginary polygon penetrate the boundary.

14. The 3D semiconductor device of claim 7, wherein top surfaces of the dummy pillars are disposed at a substantially same level as top surfaces of the vertical patterns, and wherein bottom surfaces of the dummy pillars are disposed at a substantially same level bottom surfaces of the dummy pillars.

15. The 3D semiconductor device of claim 8, wherein the dummy pillar includes the same material as the vertical patterns.

16. A three-dimensional (3D) semiconductor device comprising:
- a substrate including a first region and a second region;
- a stack structure including a plurality of electrodes vertically stacked on the substrate, each of the electrodes including sidewall on the second region and the sidewalls of the electrodes disposed at horizontal positions different from each other, respectively, on the second region;
- a plurality of vertical patterns penetrating the stack structure in the first region;
- a contact plug connected to each of the electrodes in the second region; and
- a plurality of dummy pillars penetrating the stack structure in the second region,
  wherein a set of the dummy pillars are disposed to surround a respective contact plug when viewed from a plan view.

17. The 3D semiconductor device of claim 16, wherein at least one of the dummy pillars penetrate a boundary between vertically adjacent electrodes.

18. The 3D semiconductor device of claim 16, wherein each of the vertical patterns includes a semiconductor pattern penetrating the stack structure to connected to the substrate and a vertical insulating layer surrounding a sidewall of the semiconductor pattern, and wherein each of the dummy pillars has the same structure as the vertical patterns.

19. The 3D semiconductor device of claim 16, wherein the dummy pillars penetrate all or some of the electrodes.

20. The 3D semiconductor device of claim 16, wherein the dummy pillars have a vertical length which is substantially the same as a vertical length of the vertical patterns.

* * * * *